(12) United States Patent
Huang et al.

(10) Patent No.: US 11,875,248 B2
(45) Date of Patent: Jan. 16, 2024

(54) IMPLEMENTATION OF A NEURAL NETWORK IN MULTICORE HARDWARE

(71) Applicant: Imagination Technologies Limited, Kings Langley (GB)

(72) Inventors: Xiran Huang, Hertfordshire (GB); Fernando Escobar, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 168 days.

(21) Appl. No.: 17/500,840

(22) Filed: Oct. 13, 2021

(65) Prior Publication Data
US 2022/0121914 A1  Apr. 21, 2022

(30) Foreign Application Priority Data

Oct. 13, 2020 (GB) .................................... 2016225
Oct. 13, 2020 (GB) .................................... 2016226
Oct. 13, 2020 (GB) .................................... 2016227

(51) Int. Cl.
*G06N 3/00* (2023.01)
*G06N 3/063* (2023.01)
(Continued)

(52) U.S. Cl.
CPC ............ *G06N 3/063* (2013.01); *G06N 3/04* (2013.01); *G06N 3/08* (2013.01); *G06N 3/10* (2013.01); *G11C 11/54* (2013.01)

(58) Field of Classification Search
CPC .......... G06N 3/063; G06N 3/04; G06N 3/08; G06N 3/10; G06N 3/045; G11C 11/54;
(Continued)

(56) References Cited

U.S. PATENT DOCUMENTS

2016/0314619 A1\* 10/2016 Luo .................... G06T 7/344
2019/0019014 A1\* 1/2019 Ye ..................... G06V 40/169
(Continued)

FOREIGN PATENT DOCUMENTS

CN  111222561 A  6/2020
GB  2566702 A  3/2019

OTHER PUBLICATIONS

Sangkug Lym et al: ("Mini-batch Serialization: CNN Training with Inter-layer Data Reuse", arxiv.org, Cornell University Library, 201 Olin Library Cornell University Ithaca, NY 14853, May 4, 2019 (May 4, 2019), XP081201484) and Vengallur (U.S. PG-Pub No. 2020/0233803) (Year: 2019).\*

(Continued)

*Primary Examiner* — Ping Y Hsieh
(74) *Attorney, Agent, or Firm* — Potomac Law Group, PLLC; Vincent M DeLuca

(57) ABSTRACT

A multicore hardware implementation of a deep neural network includes a plurality of layers arranged in plurality of layer groups. The input data to the network comprises a multidimensional tensor including one or more traversed dimensions that are traversed by strides in at least one layer of a first layer group, and one or more non-traversed dimensions. If a size of the input data in a first dimension is greater than a threshold, the hardware implementation splits the input data for the first layer group into at least a first tile and a second tile, along the first dimension. If the size of the input data in the first dimension is not greater than the threshold, the hardware implementation splits the evaluation of the first layer group into at least a first pass and a second pass, along a dimension other than the first dimension.

20 Claims, 15 Drawing Sheets

(51) Int. Cl.
*G06N 3/04* (2023.01)
*G06N 3/08* (2023.01)
*G11C 11/54* (2006.01)
*G06N 3/10* (2006.01)

(58) Field of Classification Search
CPC .. G06V 40/165; G06V 10/454; G06V 40/171; G06F 18/21; G06T 7/50; G06T 7/70; G06T 2207/20084; G06T 2207/30201
See application file for complete search history.

(56) References Cited

U.S. PATENT DOCUMENTS

2019/0114824 A1* 4/2019 Martinez .............. G06V 40/171
2020/0233803 A1   7/2020 Vengallur et al.

OTHER PUBLICATIONS

Lym et al,"MIni-batch Serialization: CNN Training with Inter-layer Data Reuse", Cornell University Library, 2018, abstract; pp. 1, 5 and 6; figures 4, 5, 7 and 9.
Lym Sangkug, "Efficient Deep Neural Network Model Training by Reducing Memory and Compute Demands", PHD Thesis, 2019, pp. 1-190 URL: https://repositories.lib.utexas.edu/bitstream/handle/2152/81143/LYMDISSERTATION-2019.pdf?sequence=I Chapter 3.
Anonymous, "Electronic design automation—Wikipedia", Wikipedia, 2020, pp. 1-6 URL: https :// en. wikipedia. org/w /index. php ?title= Electronic design automation&oldid=980354255.

* cited by examiner

IMPLEMENTATION OF A NEURAL NETWORK IN MULTICORE HARDWARE

BACKGROUND

A Deep Neural Network (DNN) is a type of artificial neural network that can be used for machine learning applications. In particular, a DNN can be used in signal processing applications, including image processing and computer vision applications.

DNNs have been implemented in applications where power resources are not a significant factor. Despite this, DNNs have application in a number of different technical fields in which the resources of the hardware used to implement the DNNs is such that power consumption, processing capabilities, or silicon area are limited. There is therefore a need to implement hardware that is configured to implement a DNN (or at least part thereof) in an efficient manner—for example, in a manner that requires less silicon area or less processing power when operating. Moreover, DNNs can be configured in a number of different ways for a variety of different applications. There is therefore also a need for hardware for implementing a DNN to be flexible to be able to support a variety of DNN configurations. As DNNs become more complex in structure and are required to process larger volumes of data in shorter periods of time (for example, for inference in real-time applications) there is a growing need for hardware that has greater processing capabilities, while maintaining or increasing area- and power-efficiency.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A multicore hardware implementation of a deep neural network is disclosed. A plurality of layers of the network is arranged in plurality of layer groups. The input data to the network comprises a multidimensional tensor including one or more traversed dimensions, being dimensions that are traversed by strides in at least one layer of a first layer group, and one or more non-traversed dimensions. If a size of the input data in a first dimension is greater than a threshold, the hardware implementation is configured to split the input data for the first layer group into at least a first tile and a second tile, along the first dimension. If the size of the input data in the first dimension is not greater than the threshold, the hardware implementation is configured to split the evaluation of the first layer group into at least a first pass and a second pass, along a dimension other than the first dimension.

According to an aspect, there is provided a method for implementing a deep neural network in multicore hardware, according to claim 1.

When the size is greater than the threshold, the layer groups of the neural network can be evaluated in a depth-first fashion, by splitting the data into tiles whose evaluation is distributed across multiple cores. Here, depth-first means that a given core evaluates multiple successive layer groups based on a given tile, before moving on to any other evaluation. For example, the first core evaluates the first layer group based on the first tile and then evaluates the second layer group based on the first output tile of the first layer group, before the first core evaluates any other tile or layer group. The second core acts correspondingly. Each output tile of each layer group acts as an input tile to the next layer group, up until the final layer group. Splitting the data into tiles along one or more of the traversed dimensions can enable layer groups to be processed in a depth-first manner, by layer fusion, while reducing a size requirement for the one or more second memory devices. The size reduction is possible because the one or more second memory devices do not need to store the whole tensor output by each layer group. They can store a subset of the tensor, corresponding to the tile.

When the size is not greater than the threshold, the layer groups of the neural network can be evaluated by splitting the calculations into passes whose evaluation is distributed across multiple cores. Splitting the evaluation into passes along a traversed dimension or a non-traversed dimension can enable layer groups to be processed layer group by layer group, in parallel.

There is synergy between these two approaches. If the tensor is large, it can be split into tiles along at least one traversed dimension and processed depth-first in these tiles. This may reduce the amount of data that needs to be stored in the one or more second memory devices, because it might not be necessary to store an entire intermediate tensor in them at the same time. On the other hand, if the sensor is small, it can be split into passes. In this case, even though it is necessary to store an entire intermediate tensor in the one or more second memory devices, this might not be a limiting factor because the tensor was smaller to begin with. In other words, the present method can allow parallel hardware to be utilised efficiently whether an input tensor is small or large.

Evaluating a layer group means evaluating each layer of the layer group. The layer groups may be defined such that all layers of a single layer group can be evaluated in a single hardware pass. For example, all layers of a single layer group can be evaluated in a hardware pipeline of a given core without needing to write any data to the one or more second memory devices or the one or more first memory devices. In some cases, a layer group may consist of a single layer of the neural network. In other cases, a layer group may consist of multiple layers. For example, a layer group may comprise any one or any two or more of: a single convolutional layer, a single pooling layer, a single activation layer, a single normalisation layer, and a single layer of element-wise operations. In some cases, each of the first layer group and the second layer group may include a convolutional layer. Optionally, a layer group may include at most one convolutional layer.

A cost of accessing the one or more second memory devices may be less than a cost of accessing the one or more first memory devices. The cost may be in terms of time or power consumption. For example, the one or more first memory devices may be provided as off-chip memory; the one or more second memory devices may be provided as on-chip memory.

The traversed dimensions may include an X dimension (columns) and a Y dimension (rows), and optionally a batch dimension, B. The input data may comprise one or more additional, non-traversed dimensions, such as a channel dimension, C. The input data may be processed by a number of filters, to produce a respective number of output channels F.

The step of splitting the input data (and/or splitting the evaluation) may be planned in advance, before beginning the evaluation of layer groups. In other words, the splitting may be planned before a training phase or inference phase of the neural network begins. The splitting may be planned in advance based on the parameters of the layers in the various layer groups, and the tensor size at the input and output of each layer.

In the case that the size is greater than the threshold, the plurality of layer groups may form a tile group. A tile group is a set of layer groups that is processed together, depth first, based on each tile. A tile group begins with an initial layer group and terminates with a final layer group. The output tile of the final layer group in the tile group may be stored in the one or more first memory devices.

The deep neural network may be a convolutional neural network.

The sizes of tiles may vary within and between layer groups. In particular, the leading tile and the trailing tile of input data for a layer group can differ in size from the other tiles for that layer group. The leading tile in the earlier layer groups of a tile group may be larger than the leading tile in later layer groups of the tile group, because of the effects of data-dependency. Other tiles (namely, those tiles between the leading tile and the trailing tile) may be of uniform size for a given layer group. These combined factors may mean that the trailing tile tends to shrink, towards the earlier layer groups.

The leading tile of the initial layer group may be larger than all other tiles of that layer group. This can occur because of the "growth" of the leading tile, backwards through the layer groups, due to data dependency.

The tile sizes may be selected so that the size of the leading tile in the final layer group is smaller than some or all of the other tiles in the final layer group. This can help to balance the load across the different cores, by mitigating the "growth" of the leading tile, backwards through the layer groups. If the leading tile in any given layer group is too large, then that tile may hold up the overall evaluation (see also the comments below in relation to synchronisation between cores). Reducing the size of the initial tile in the final layer group reduces it for all layer groups (because of data-dependency), thereby helping to avoid a situation in which an initial tile is much larger (and takes much longer to process) than other tiles.

The method may further comprise if the size is not greater than the threshold, splitting the evaluation of the second layer group into at least a first pass and a second pass, along a dimension other than the first dimension; allocating the first pass for the second layer group to the first core and allocating the second pass for the second layer group to the second core; using the first core, evaluating the second layer group for the first pass, to generate a first portion of output data; and using the second core, evaluating the second layer group for the second pass, to generate a second portion of output data, each of said first portion of output data and said second portion of output data comprising a plurality of data elements.

In other words, if the tensor is small, the second layer group, like the first layer group, may be split into passes over the multiple cores. The first and second layer groups may be split along different dimensions. The method is flexible, in that the different layer groups need not be split along the same dimension. The split can be chosen according to whatever is more efficient for the layer group in question, given the capabilities of the hardware.

Each of the first and second output tiles of the first layer group may comprise a plurality of data elements in each of the one or more traversed dimensions. Each of the first and second output tiles of the second layer group may comprise a plurality of data elements in each of the one or more traversed dimensions. Each first and second portion of the output data may comprise data elements in each of the one or more traversed dimensions.

The method may further comprise storing output data of a final one of the plurality of layer groups in the one or more first memory devices. The method may further comprise, if the size is greater than the threshold, storing the first output tile and the second output tile of a final one of the plurality of layer groups in the one or more first memory devices. In this way, intermediate data generated when evaluating the layer groups is stored in the one or more second memory devices, and the output data generated by evaluating the final layer group is stored in the one or more first memory devices.

If the size is greater than the threshold, splitting the input data for the first layer group may comprise splitting it into the first tile, the second tile and a third tile. The method may further comprise, after evaluating, using the first core, each layer group based on the first tile, evaluating, using the first core, each layer group based on the third tile.

This may be done when the layer group is split into a number of tiles that is greater than the number of cores in the multicore hardware. The number of tiles may be chosen so that it is an integer multiple of the number of cores (for at least one of the layer groups). The evaluation of all the layer groups of the tile group based on the first and second tiles is referred to as a first multi-core tile pass. The evaluation of all the layer groups based on the third tile then represents (at least part of) a second multi-core tile pass. Note that if the third tile is the trailing tile of the plurality of tiles, then the second core may be idle during the second multi-core tile pass.

The one or more second memory devices may comprise: a local memory for the first core that is accessible only to the first core; a local memory for the second core that is accessible only to the second core; and a shared memory that is accessible to the first core and the second core. The method may further comprise, if the size is greater than the threshold: identifying a disposable portion of the first output tile of the first layer group, which is needed only for evaluating the second layer group based on the first tile; and identifying an overlap portion of the first output tile of the first layer group, which is needed for evaluating the second layer group based on the first tile and is also needed for evaluating the second layer group based on the second tile. The method may comprise, when storing the first output tile of the first layer group in the one or more second memory devices: writing the disposable portion of the first output tile to the local memory of the first core; and writing the overlap portion of the first output tile to the shared memory.

A third tile may be allocated to the first core, as discussed above. The method may further comprise identifying a disposable portion of the second output tile of the first layer group, which is needed only for evaluating the second layer group based on the second tile; and identifying an overlap portion of the second output tile of the first layer group, which is needed for evaluating the second layer group based on the second tile and is also needed for evaluating the second layer group based on the third tile. The method may comprise, when storing the second output tile of the first layer group in the one or more second memory devices: writing the disposable portion of the second output tile to the local memory of the first core; and writing the overlap portion of the second output tile to the shared memory.

The overlap portion of the second output tile may be preserved in the shared memory for longer than the overlap portion of the first output tile. In particular, the overlap portions may be retained in the shared memory for (only) as long as they are needed. The overlap portion of the first output tile may be retained until it has been used by the second core when evaluating the second layer group based on the second output tile. The overlap portion of the second output tile may be retained until it has been used by the first core when evaluating the second layer group based on the third output tile.

The first layer group may include a convolutional layer, and the method may further comprise storing weight values and/or bias values for the convolutional layer in the shared memory. This can allows each of the cores to access the coefficient (weight and/or bias) data, to evaluate the convolutional layer for its respective tile or tiles.

The method may comprise, if the size is greater than the threshold: waiting for the first core to finish evaluating the first layer group for the first tile and waiting for the second core to finish evaluating the first layer group for the second tile, before evaluating the second layer group for the second tile using the second core.

This may represent a minimum synchronisation condition to satisfy data-dependency requirements, in particular when the first output tile comprises overlap data. It reflects the fact that the second core will require (i) the overlap data of the first output tile of the first layer group, as well as (ii) the second output tile of the first layer group, in order to evaluate the second layer group based on the second tile. The existence of overlap data will depend on the structure of the network. For example, a convolutional layer will generate overlap data if the kernel size is greater than the stride (ignoring dilation size); a convolution-transpose will generate overlap data if the stride is greater than one; and a pooling layer will generate overlap data if the kernel size or stride is greater than one.

Optionally, the method may comprise waiting for all cores to finish evaluating the first layer group before any core begins evaluating the second layer group.

In principle, the minimum synchronisation condition allows the possibility for each core to continue its depth-wise processing of tiles, as long as the necessary overlap data from the preceding tile is available. Allowing cores to "free-run" in this way may result in some cores getting significantly ahead of others in their processing. Although in principle this may be a good way to utilise cores to their full potential, in practice, the present inventors have recognised that it generally does not lead to an overall gain in performance. After a certain number of layer groups (the "tile group") have been processed depth-wise, the output data may be written to the one or more first memory devices. The tile group may comprise a subset of the layers of the neural network, or it may comprise all of the layers of the neural network. The tile group is not complete until all of the constituent tiles have been completed. Therefore, the hardware is inevitably still limited by the slowest path over the parallel evaluation operations on the tiles. Meanwhile, there may be a significant administrative overhead to support free-running. Consequently, the hardware implementation may be simplified by synchronising all of the cores after every layer group, without slowing down the processing. On the other hand, in some applications (for example, speech processing) it may be advantageous for some of the output data to be available early. In this case, the reduced latency to produce the first output, which can be achieved by free-running, may justify the added administrative overhead.

The one or more traversed dimensions may further comprise a second dimension, wherein the input data is stored in the one or more first memory devices ordered according to the second dimension first. For example, the input data may be stored row-first—in other words, ordered according to the X dimension. In this case, the input data may be split into tiles in the Y dimension. Alternatively, the input data may be stored column-first (ordered according to the Y dimension first), and it may be split into tiles along the X dimension.

Splitting in this way may be advantageous when the input data elements are packed tightly into the memory, and there is no one-to-one correspondence between the data elements and a burst size for reading and writing the memory. It can allow the data to be split up by reading one contiguous group of bursts from the memory for each tile. Likewise, when reassembling the output tiles of the final layer group, it may be possible to write each output tile by a single contiguous group of bursts.

In some embodiments, the input data may be split only along the first dimension, whereby the tiles have the full size of the original tensor in the second dimension.

If the size of the input data in the first dimension is not larger than the threshold size, the evaluation may be split along the second dimension, or another dimension.

If the size is not greater than the threshold, splitting the evaluation of the first layer group may comprise splitting it into the first pass, the second pass and a third pass. The method may further comprise, after evaluating, using the first core, the first layer group for the first pass, evaluating, using the first core, the first layer group for the third pass. This may be done when the layer group is split into a number of passes that is greater than the number of cores in the multicore hardware.

The one or more second memory devices may comprise: a local memory for the first core that is accessible only to the first core; a local memory for the second core that is accessible only to the second core; and a shared memory that is accessible to the first core and the second core. The method may comprise, if the size is not greater than the threshold, storing the first portion of output data and the second portion of output data in the shared memory.

The first layer group may comprise a convolutional layer, and the method may further comprise: storing weight values and/or bias values for the convolutional layer in the shared memory, if the evaluation was split along one of the traversed dimensions; or splitting up the weight values and/or bias values and storing them in the local memories, if the evaluation was split along one of the non-traversed dimensions.

When the evaluation is are split along one of the traversed dimensions, the same weights/biases need to be applied to every part of the data, and therefore every core needs access to all of the same weights/biases. On the other hand, if the evaluation is split according to input channels or output channels of the layer group, it may be possible for each core to process one or more input channels or output channels, while other cores process one or more other input channels or output channels. Thus, the weights/biases associated with a given input channel or output channel may be stored locally to the core that needs to use them.

The evaluation may be split according to input channel, wherein the first layer group comprises no convolutional layer, and wherein the method comprises splitting up parameters of the first layer group and storing them in the local memories.

The parameters may include parameters controlling pooling, normalisation, or element-wise operations. The parameters may include stride and/or window size, for the respective input channel, for example.

Also provided is a hardware implementation of a deep neural network, according to claim 13.

Each core may comprise a plurality of processing elements configured to process input data to evaluate a layer of the neural network. The cores may be configured to operate in parallel.

The one or more second memory devices optionally comprise: a local memory for the first core that is accessible only to the first core; a local memory for the second core that is accessible only to the second core; and a shared memory that is accessible to the first core and the second core. The splitter may be configured to, if the size in the first dimension is greater than the threshold: identify a disposable portion of the first output tile of the first layer group, which is needed only for evaluating the second layer group based on the first tile; and identify an overlap portion of the first output tile of the first layer group, which is needed for evaluating the second layer group based on the first tile and also needed for evaluating the second layer group based on the second tile. The first core may be configured, when storing the first output tile of the first layer group in the one or more second memory devices to: write the disposable portion to its local memory; and write the overlap portion to the shared memory.

The second core may be configured to retrieve the overlap portion from the shared memory, when evaluating the second layer group based on the second tile.

Storing overlap data such that it is accessible to the second core can avoid the need to recalculate the overlap data when evaluating the second layer group based on the second tile.

Alternatively, the need to store the overlap data may be avoided by calculating the overlap data in both the first core and the second core. In other words, all data needed by a core for a subsequent layer group may be calculated by that core. In this case, the first output tile of the first layer group and the second output tile of the first layer group would contain a common portion (corresponding to the overlap portion). This approach results in some duplication of calculations between the parallel-operating cores; however, it has the advantage that none of the cores needs to wait for any other core at the end of a layer group—that is, each core has complete freedom to free-run, independent of the calculations being performed by any of the other cores. The first output tile of the first layer group can be stored entirely in the local memory of the first core; and the second output tile of the first layer group can be stored entirely in the local memory of the second core.

The second core may be configured to, if the size in the first dimension is greater than the threshold, wait for the first core to finish evaluating the first layer group based on the first tile and wait for the second core to finish evaluating the first layer group based on the second tile, before evaluating the second layer group based on the second tile. Alternatively or in addition, each core may be configured to wait for all cores to finish evaluating the first layer group before evaluating the second layer group.

The splitter unit may be configured to, if the size in the first dimension is not greater than the threshold, split the evaluation of the first layer group into the first pass, the second pass and a third pass, and allocate the third pass to the third core. The first core may be configured to evaluate the first layer group for the third pass after it has finished evaluating the first layer group for the first pass.

Where the first layer group comprises a convolution layer, the splitter unit may be configured to store weight values and/or bias values for the convolution layer in the shared memory if the evaluation was split along one of the traversed dimensions; and split the weight values and/or bias values and store them in the local memories if the evaluation was split along one of the non-traversed dimensions. If the evaluation is split according to input channel and the first layer group comprises no convolution layer, the splitter unit may be configured to split up parameters of the first layer group and store them in the local memories.

Also provided is an artificial intelligence accelerator system comprising a hardware implementation as claimed in any of claims 13 to 1726, or as summarized above. Also provided is an artificial intelligence accelerator system configured to perform a method as summarized above or a method according to any of claims 1 to 12. Such artificial intelligence accelerator systems may be embodied in hardware on an integrated circuit.

Also provided is a method of manufacturing, using an integrated circuit manufacturing system, an artificial intelligence accelerator system as claimed in claim 18.

Also provided is a method of manufacturing, using an integrated circuit manufacturing system, an artificial intelligence accelerator system as claimed in claim 18, the method comprising: processing, using a layout processing system, a computer readable description of the artificial intelligence accelerator system so as to generate a circuit layout description of an integrated circuit embodying the artificial intelligence accelerator system; and manufacturing, using an integrated circuit generation system, the artificial intelligence accelerator system according to the circuit layout description.

Also provided is computer readable code configured to cause the method of any of claims 1 to 12 to be performed when the code is run. Also provided is a computer readable storage medium having encoded thereon the computer readable code.

Also provided is an integrated circuit definition dataset that, when processed in an integrated circuit manufacturing system, configures the integrated circuit manufacturing system to manufacture an artificial intelligence accelerator system as claimed in claim 18.

There is also provided a non-transitory computer readable storage medium having stored thereon a computer readable description of an artificial intelligence accelerator system as claimed in claim 18 that, when processed in an integrated circuit manufacturing system, causes the integrated circuit manufacturing system to manufacture an integrated circuit embodying the artificial intelligence accelerator system.

Also provided is a non-transitory computer readable storage medium having stored thereon a computer readable description of an artificial intelligence accelerator system as claimed in claim 18 which, when processed in an integrated circuit manufacturing system, causes the integrated circuit manufacturing system to: process, using a layout processing system, the computer readable description of the artificial intelligence accelerator system so as to generate a circuit layout description of an integrated circuit embodying the artificial intelligence accelerator system; and manufacture, using an integrated circuit generation system, the artificial intelligence accelerator system according to the circuit layout description.

Also provided is an integrated circuit manufacturing system configured to manufacture an artificial intelligence accelerator system as claimed in claim 18.

There is also provided an integrated circuit manufacturing system comprising: a non-transitory computer readable storage medium having stored thereon a computer readable description of an artificial intelligence accelerator system as claimed in claim 18; a layout processing system configured to process the computer readable description so as to generate a circuit layout description of an integrated circuit embodying the artificial intelligence accelerator system; and an integrated circuit generation system configured to manufacture the artificial intelligence accelerator system according to the circuit layout description.

The layout processing system may be configured to determine positional information for logical components of a circuit derived from the integrated circuit description so as to generate a circuit layout description of an integrated circuit embodying the artificial intelligence accelerator system.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
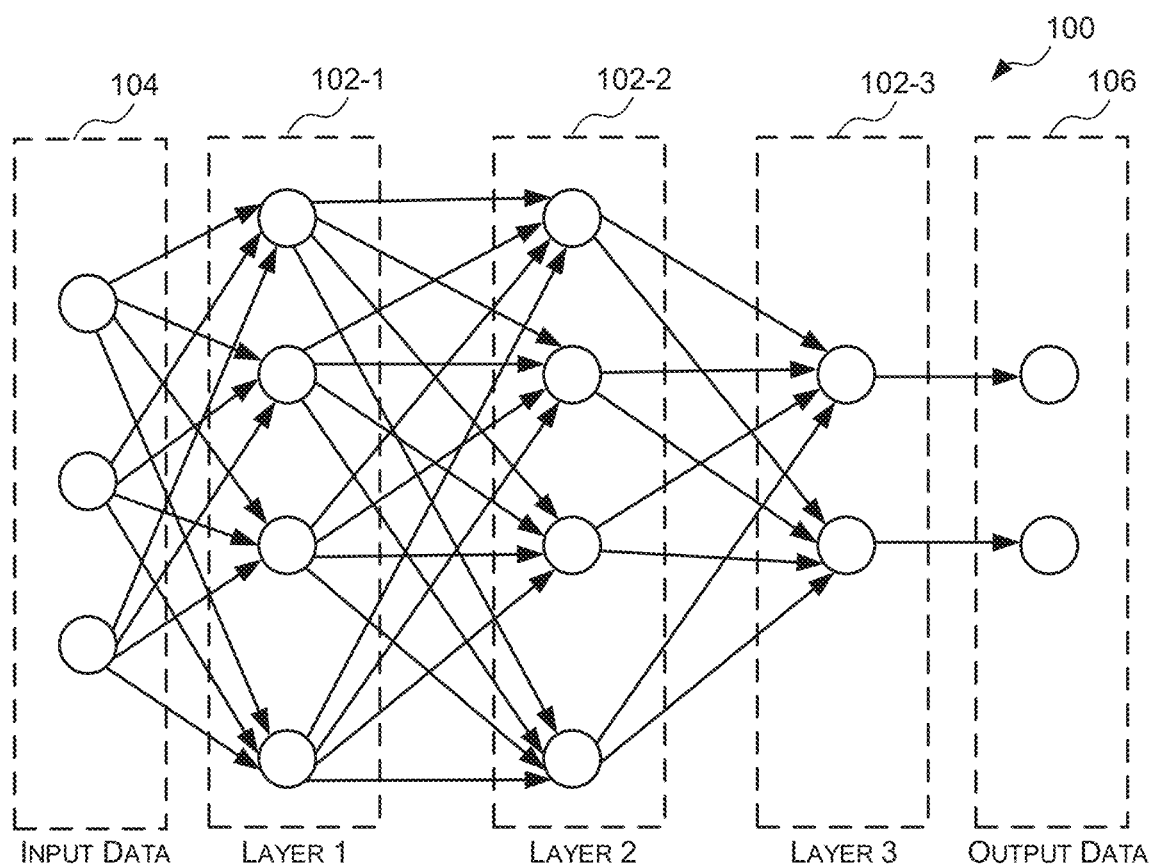
FIG. 1 is a schematic diagram of an example deep neural network (DNN)

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments will now be described by way of example only.

A Deep Neural Network (DNN) is a form of artificial neural network comprising a plurality of interconnected layers that can enable the DNN to perform signal processing tasks, including, but not limited to, computer vision tasks. FIG. 1 illustrates an example DNN 100 that comprises a plurality of layers 102-1, 102-2, 102-3. Each layer 102-1, 102-2, 102-3 receives input data, and processes the input data in accordance with the layer to produce output data. The output data is either provided to another layer as input data to that layer, or is output as the final output data of the DNN. For example, in the DNN 100 of FIG. 1 the first layer 102-1 receives the original input data 104 to the DNN 100 and processes the input data in accordance with the first layer 102-1 to produce output data. The output data of the first layer 102-1 becomes the input data to the second layer 102-2, which processes the input data in accordance with the second layer 102-2 to produce output data. The output data of the second layer 102-2 becomes the input data to the third layer 102-3, which processes the input data in accordance with the third layer 102-3 to produce output data. The output data of the third layer 102-3 is output as output data 106 of the DNN.

The processing that is performed on the input data to a layer depends on the type of layer. For example, each layer of a DNN may be one of a plurality of different types. Example DNN layer types include, but are not limited to: a convolution layer, an activation layer, a normalisation layer, a pooling layer and a fully connected layer. It will be evident to a person of skill in the art that these are example DNN layer types and that this is not an exhaustive list and there may be other DNN layer types.

A convolution layer is configured to convolve the input data using weights associated with that layer. Specifically, each convolution layer is associated with a plurality of weights $w_1 \ldots w_i$, which may also be referred to as filter weights or coefficients. The weights may be grouped to form or define one or more filters or kernels.

Figure 2:
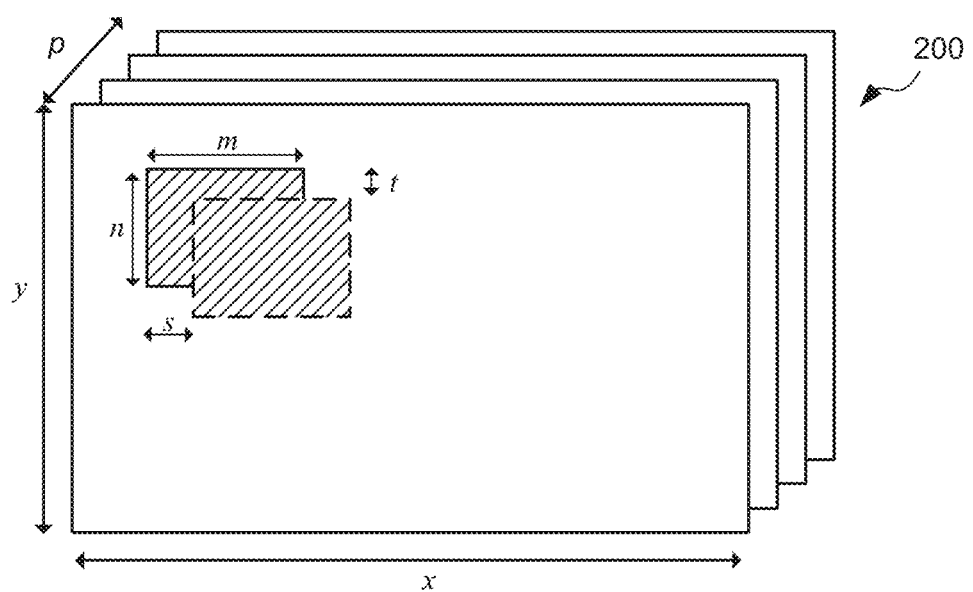
FIG. 2 is a schematic diagram of example data in a DNN.

Reference is made to FIG. 2, which illustrates an example of the format of data 200 utilised in a DNN. As can be seen in FIG. 2, the data 200 used in the DNN may be arranged as p planes of data, where each plane has a dimension x×y. A DNN may comprise one or more convolution layers, each of which is associated with a plurality of filters, each of which comprises a plurality of weights. Each filter has a dimension m×n×p (that is, each filter comprises a set of m×n×p weights w) and is applied to the input data according to a convolution operation across several steps (known as strides) s and t, as illustrated in FIG. 2. The group of data elements to which the filter is applied at each stride is referred to as a window. Each filter produces one output plane. The number of filters and the number of weights per filter may vary between convolution layers. A convolutional neural network (CNN), which is a specific type of DNN that is effective for image recognition and classification, generally comprises a plurality of convolution layers.

Before describing the multicore hardware implementations that are the subject of the present invention, a single-core example will be described. A (single-core) hardware implementation of a convolution layer may comprise a hardware module or block (which may be referred to herein as a "processing element") that is configured to calculate the sum of the products between the weights forming all or a portion of a filter and input data values forming all or a portion of a window (which may be referred to as a filter-window calculation). Since typically a high number of such filter-window calculations is performed, some hardware implementations may comprise a plurality of such processing elements so that more than one filter-window calculation can be performed in parallel. Preparing each processing element to perform a filter-window calculation involves reading the appropriate input data and weights for each filter-window calculation from one or more first memory devices and providing it to one of the processing elements. Typically, it is necessary to transfer a large amount of data from the memory to the processing elements. If this is not done efficiently, it can result in a high memory bandwidth requirement, and high-power consumption, for providing the input data and weights to the processing elements. This is particularly the case when the memory is "off-chip"—that is, implemented in a different integrated circuit or semiconductor die from the processing elements.

Accordingly, described herein are hardware implementations of neural networks, and methods for processing data in such hardware implementations, in which the input data and weights are provided to the processing elements in an efficient manner, to reduce the memory bandwidth required for, and power consumed by, providing the input data and weights to the processing elements. In particular, blocks (also referred to as "tiles") of data may be processed in a depth-wise manner, through a plurality of layers of the neural network. Intermediate outputs of the layers within the plurality of layers can be stored in one or more second memory devices. The one or more second memory devices may be smaller in size than the one or more first memory devices that are used for bulk storage of data, but may be quicker and/or more energy efficient to access. In one example, at least one of the one or more second memory devices is provided on-chip (that is, in the same integrated circuit or semiconductor die as the processing elements).

Figure 3:
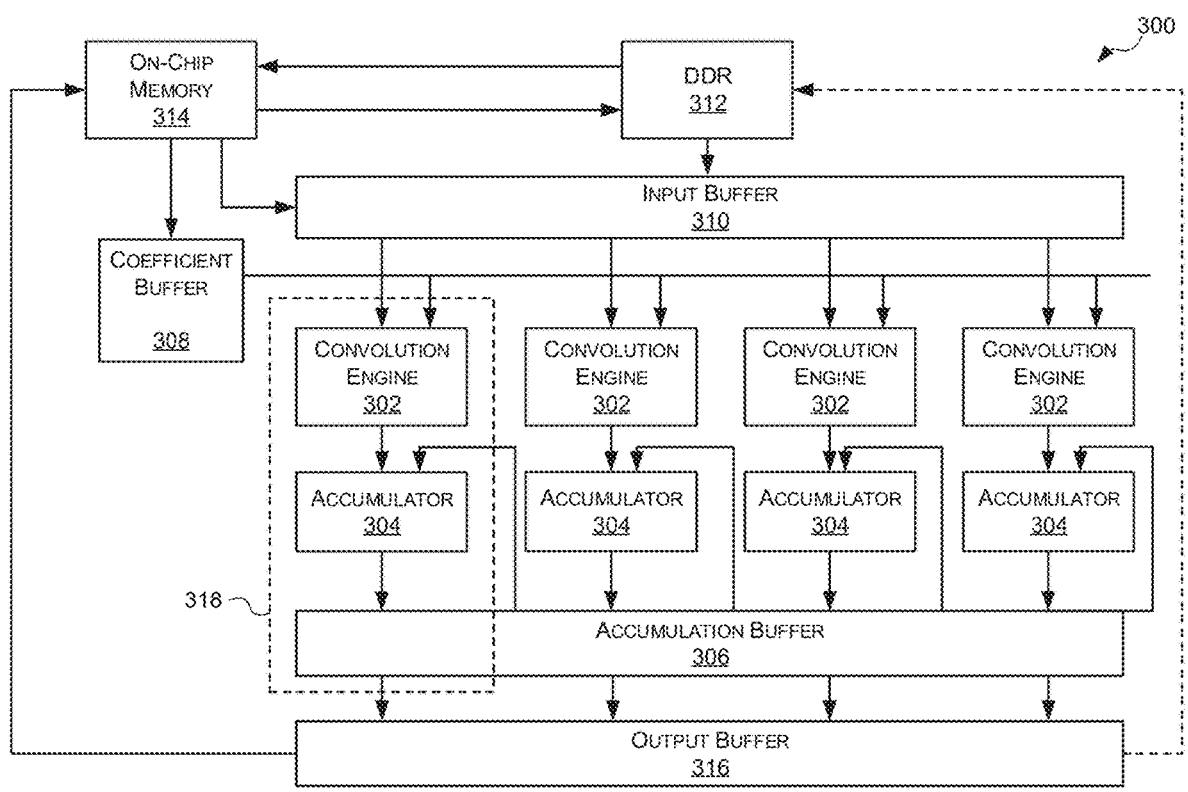
FIG. 3 is a block diagram of an example hardware implementation of a convolution layer of a DNN.

Reference is now made to FIG. 3, which illustrates an example single-core hardware implementation 300 of a convolution layer of a DNN. The hardware implementation 300 comprises a plurality of convolution engines 302, a plurality of accumulators 304, an accumulation buffer 306, a coefficient buffer 308, and an input buffer 310. Each convolution engine 302, together with its respective accumulator 304 and its share of the resources of the accumulation buffer 306, represents a processing element 318. The hardware implementation further comprises a double data rate (DDR) SDRAM 312, which is an off-chip memory; an on-chip memory (OCM) 314, and an output buffer 316.

Figure 4:
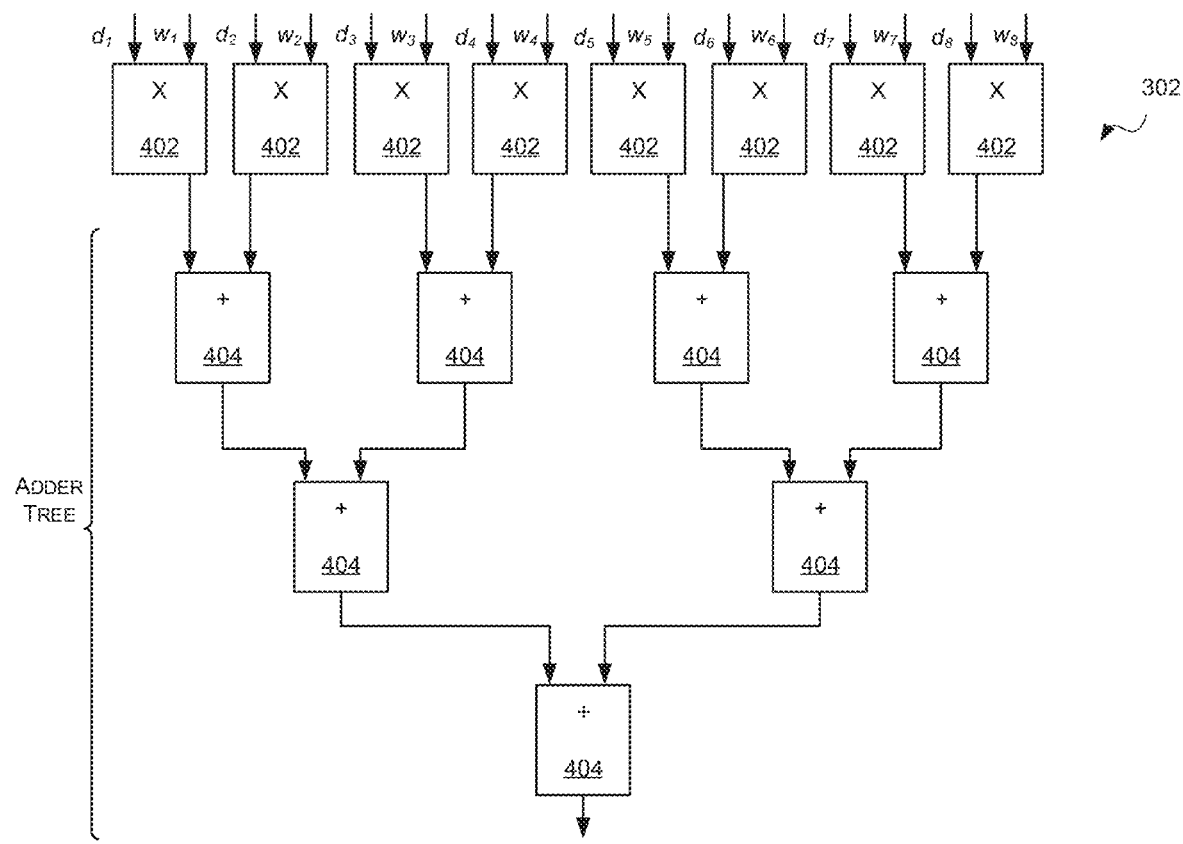
FIG. 4 is a block diagram of an example convolution engine of FIG. 3.

Each convolution engine 302 comprises hardware logic configured to receive a set of weights, e.g. $\{w_1 \ldots w_8\}$, that represent all or a portion of a filter, and a set of input data values, e.g. $\{d_1 \ldots d_8\}$, that represent all or a portion of a window, and perform a multiply-accumulate calculation on the received weights and input data values as depicted in FIG. 4. In some examples, as shown in FIG. 4, each convolution engine 302 may comprise a plurality of multipliers 402, each of which is configured to multiply a weight ($w_i$) and a corresponding input data value ($d_i$) to produce a multiplication output value. The multipliers 402 are followed by a plurality of adders 404 that form an adder tree to calculate the sum of the multiplication outputs. In the example of FIG. 4, the convolution engine 302 comprises eight multipliers 402, but in other examples there may be more or fewer multipliers. For example, in some cases there may be 128 multipliers. Generally, if there are Z multipliers 402 the adder tree comprises Z−1 adders 404.

In some cases, the multiply-accumulate calculation is pipelined. For example, the multipliers 402 and adders 404 may be divided into a number of pipeline stages with a register stage (not shown) before the first pipeline stage and between each pair of pipeline stages. For example, the multipliers may form a first pipeline stage and the adders may be divided into layers wherein the subsequent pipeline stages comprise one or more layers of adders.

The example hardware implementation 300 of FIG. 3 comprises four convolution engines 302; however, it will be evident to a person of skill in the art that the methods and principles described herein are applicable to hardware implementations with any number of convolution engines.

Since it may take more than one hardware pass of a convolution engine to generate a complete filter result (e.g. because a convolution engine may only receive and process a portion of the weights of a filter and/or a portion of the input data values of a window in a cycle) the hardware implementation may comprise a plurality of accumulators 304. Each accumulator 304 receives the output of one convolution engine 302 and adds the output to the previous convolution engine output that relates to the same filter. Since the convolution engine may not generate or produce outputs that relate to the same filter in consecutive cycles the partial results of one or more filters may be stored in an accumulation buffer 306 and then the appropriate partial result may be provided to the accumulator each cycle by the accumulation buffer 306. In some examples, the accumulation buffer 306 may be able to store partial results related to 128 different filters.

The coefficient buffer 308 comprises memory (not shown) to store a plurality of weights related to a convolution layer (or fully connected layer) of the DNN, and hardware logic (not shown) to provide the weights to the convolution engines 302 for processing in a predetermined order over a plurality of cycles. The plurality of weights may comprise all of the weights related to the convolution layer or only a portion of the weights related to a convolution layer. Although the coefficient buffer 308 is shown as a single module, the coefficient buffer 308 may be implemented by a plurality of coefficient buffers that each form a bank, for example.

The input buffer 310 comprises memory (not shown) to store a plurality of input data values related to a convolution layer (or fully connected layer) of the DNN and hardware logic (not shown) to provide the input data values to the convolution engines 302 for processing in a predetermined order over a plurality of cycles. The plurality of input data values may comprise all of the input data values related to the convolution layer or only a portion of the input data values related to a convolution layer. Although the input buffer 310 is shown in FIG. 3 as a single module, the input buffer 310 may be implemented by a plurality of input buffers that each form a bank, for example.

The DDR 312 is coupled to the on-chip memory 314, for providing weight data to the on-chip memory 314. The DDR 312 is also coupled to the input buffer 310, for providing blocks of input data to the input buffer 310. The on-chip memory 314 is coupled to the coefficient buffer 308, for providing weight data to the coefficient buffer 308. The on-chip memory 314 is also coupled to the input buffer 310, for providing intermediate output data (which comprises input data to subsequent layers) to the input buffer 310. The on-chip memory 314 is also coupled to the DDR 312, for providing blocks of output data of the end layer of the plurality of layers to the DDR 312. The accumulation buffer 306 is coupled to the output buffer 316, to allow the output buffer to receive intermediate output data of the layers within the plurality of layers, as well as the output data of the end layer. The output buffer 316 is coupled to the on-chip memory 314, for providing the intermediate output data and output data of the end layer to the on-chip memory 314.

The various connections are shown separately in the example of FIG. 3; but, in some embodiments, some or all of them may be provided by one or more shared bus connections. It should also be understood that other connections may be provided, as an alternative to or in addition to those illustrated in FIG. 3. For example, the output buffer 316 may be coupled to the DDR 312, for providing output data directly to the DDR 312. As a further example, the DDR 312 may be coupled to the coefficient buffer 308, for providing weight data directly to the coefficient buffer 308. Likewise, in some cases, not all of the connections illustrated in FIG. 3 are necessary. For example, the DDR 312 need not always be coupled to the input buffer 310—the input buffer could alternatively obtain input data from the DDR 312 via the on-chip memory 314.

Figure 5:
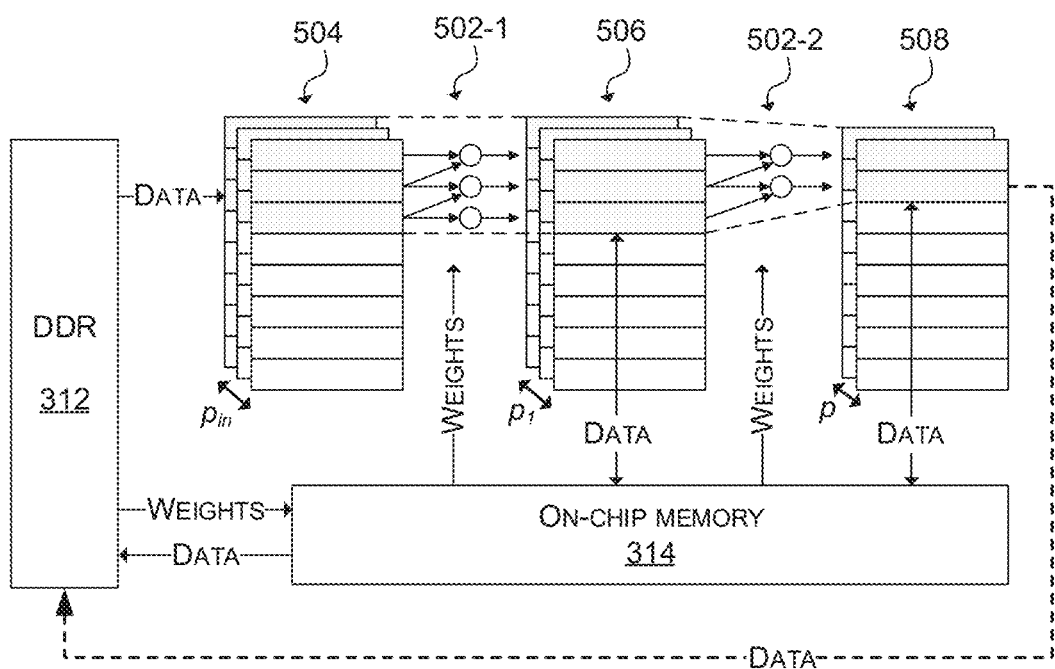
FIG. 5 is a schematic diagram illustrating a flow of data according to an example hardware implementation.

FIG. 5 is a simplified schematic diagram, to better illustrate the flow of data according to one example of a hardware implementation like that of FIG. 3. FIG. 5 shows a plurality of layers (consisting of two layers 502-1, 502-2) of a neural network. These may be any two successive layers of the network. Note also that the plurality of layers is not limited to two layers. The diagram shows the input data 504 to the first layer 502-1 of the plurality of layers. The intermediate output data 506 of the first layer 502-1 forms the input data to the second layer 502-2 (which is the end layer in this two-layer example). The diagram also shows the output data 508 of the second layer 502-2 (end layer). The DDR 312 is a first memory device, with a relatively high cost of reading/writing. The on-chip memory 314 is a second memory device, with a relatively lower cost of reading/writing. For example, it may take more time and energy to read/write a given amount of data from/to the DDR than from/to the on-chip memory 314. It will be appreciated that DDR memory is just one example of a bulk memory storage device, and other memory/storage technologies can also be used, such as flash memory.

According to the example of FIG. 3 and FIG. 5, the DDR 312 stores input data for the first layer 502-1 of the plurality of layers 502-1, 502-2. The DDR 312 also stores weight data representing weights for the plurality of layers 502-1, 502-2. In the present example, the weight data is transferred from the DDR 312 to the on-chip memory 314. The coefficient buffer 308 reads the weight data from the on-chip memory 314 and provides the weight data to the processing elements 318. The input buffer 310 reads, from the DDR 312, a first subset of the input data, representing a first block of the input data 504. This first subset of the input data 504 (also referred to herein as a "leading tile") is shown shaded in grey in FIG. 5 and may comprise one or more planes of data. The input buffer 310 provides the first subset of input data 504 to the processing elements 318. The processing elements 318 process the weight data and the first subset of the input data 504 to evaluate each layer of the plurality of layers and thereby calculate a first block of output data 508 for the end layer. This first block of output data 508 is shown shaded in grey in FIG. 5 and may comprise one or more planes of data. The output buffer 316 may write the first block of output data 508 to the on-chip memory 314. From there, the first block of output data 508 may be transferred to the DDR 312. Alternatively, the output buffer may write the output data directly into the DDR memory 312 (as indicated by the dashed arrow in FIGS. 3 and 5).

As indicated in FIG. 5, the data input to and output from each layer is arranged in one or more planes (also referred to herein as input and output data sets). In the example illustrated in FIG. 5, the input data 504 comprises $pi_n=3$ planes of data. The intermediate output data 506 of the first layer 502-1 comprises $p_1=3$ planes of data. The output data 508 of the second layer 502-2 comprises p=2 planes of data. The number of planes depends on the weight data. In particular, the weights making up each filter take a predetermined number of input planes as input data, and each filter outputs a plane of output data. The number of planes of data produced by a given layer is thus equal to the number of filters applied by that layer. Each plane of data may represent a feature map. In the example of FIG. 5, the three planes of input data 504 might represent three feature maps generated by an earlier layer of the neural network (if the first layer 502-1 in the drawing is not the first layer of the neural network). Alternatively (if the first layer 502-1 is the first layer of the neural network), the three planes of input data 504 may represent three planes of input data. Input data having multiple planes arises frequently in image-processing tasks, for example. Such input planes may include but are not limited to: Red, Green, and Blue (RGB) planes; or Hue, Saturation, and Value (HSV) planes. The input planes could also include depth data as one of the input planes.

In order to calculate the first block of output data, the processing elements 318 must evaluate each layer of the plurality of layers (as mentioned above). In particular, the coefficient buffer 308 reads the weight data for the first layer 502-1 from the on-chip memory 314. The processing elements 318 process the weight data for the first layer 502-1 and the first subset of the input data 504 to evaluate the first layer 502-1 of the plurality of layers, and thereby calculate output data 506 of the first layer. This is a block of output data of the first layer 502-1 corresponding to the first block of input data 504. In other words, it is a subset of the complete set of output data of the neural network for the first layer 502-1. This block/subset is shaded in grey in FIG. 5. The output buffer 316 writes the block of output data of the first layer 502-1 to the on-chip memory 314. It represents intermediate output data that will be needed as input data to the next layer (second layer 502-2). In order to evaluate the next layer (second layer 502-2), the input buffer 310 reads, from the on-chip memory 314, the block of the output data 506 of the first layer 502-1 that was stored there by the output buffer 316. The coefficient buffer 308 reads the weight data for the second layer 502-2 from the on-chip memory 314. The processing elements 318 process the weight data for the second layer 502-2 and the block of the output data 506 of the preceding (first) layer, to evaluate the second layer 502-2 and thereby calculate output data of the second layer 502-2. This procedure continues for any subsequent internal layers of the plurality of layers—saving the intermediate output data in the on-chip memory 314 each time, and reading this intermediate output data to provide the input data to the next layer. This continues until the end layer is reached. In the example of FIG. 5, the second layer 502-2 is the end layer. The output of the second layer 502-2 is therefore the first block of the output data 508. As explained already above, the output buffer 316 may write the first block of output data 508 to the on-chip memory 314. From there, the first block of output data 508 may be transferred to the DDR 312. Alternatively, the output buffer 316 may write the output data directly to the DDR 312 (dashed arrow).

Processing a subset (tile) of input data through multiple layers of the neural network, in this way, can efficiently utilise the processing resources of the processing elements 318. Writing the intermediate output data to the on-chip memory 314 and reading it from the on-chip memory 314 to process the next layer reduces the need to read and write data from the off-chip DDR 312, which can help to reduce power consumption. Note that the on-chip memory 314 can be significantly smaller than the off-chip DDR 312, because the on-chip memory 314 only needs to store data associated with the current block of input data, the current block of output data, and the associated blocks of intermediate output data for the internal layers, during each pass. This contrasts with the conventional approach to evaluating layers of a neural network, whereby each layer is processed independently in its entirety and the memory needs to be able to store the entire input data and entire output data of a layer at any given time. This requires a much larger memory, which is typically impractical to implement as on-chip memory. Consequently, the conventional approach in practice requires the use of off-chip memory to store the intermediate output data. Since off-chip read- and write-operations typically consume much more energy than on-chip read- and write-operations, reducing the amount of data written to the off-chip memory can result in significant savings in power consumption.

The size of the block to be processed in each pass can be chosen based on the available storage capacity of the on-chip memory 314, the number of layers in the plurality of layers, and the structure of the neural network. An example approach for memory management in the on-chip memory 314 will be described below. First, it is useful to consider how a block of output data of a plurality of layers in a neural network depends on intermediate output data of the preceding layers and input data for the first layer. This can be understood with reference to FIG. 6. This shows the input data to three layers (not shown explicitly) of a neural network; the output data of the first layer (here labelled as layer 0); the output data of the second layer (labelled layer 1); and the output data of the end layer. For simplicity, it is convenient to think of the output data of the end layer as a single feature map created by a single filter. Likewise, the other layers may be thought of as convolutional layers, with a single filter, creating a single output feature map, as shown in simplified form in the drawings. Of course, the scope of the present disclosure is not limited in this way—these are simplifications purely for ease of understanding. At each layer, a single filter could be applied to multiple input channels (feature maps), or multiple filters could be applied to one input channel or multiple input channels, thereby processing and/or generating multiple planes of data. Methods and hardware implementations according to the present disclosure can be used equally in such scenarios.

Starting from a first block of output data ($Tile_1$) in the end layer, it is possible to trace backwards through the network to find the intermediate data and input data upon which this output block depends. There is a block of data ($Tile_1$) in the layer 1 output that corresponds to $Tile_1$ in the end layer, in the sense that $Tile_1$ in layer 1 is needed to calculate $Tile_1$ in the end layer. Let us assume that the filter has a kernel size greater than 1. Because of this kernel size, $Tile_1$ in the layer 1 output is larger than $Tile_1$ in the end layer output. In other words, $Tile_1$ in the end layer output depends on some additional data in the layer 1 output. For example, for a 3×3 kernel and a stride of 1, one extra row of output data is needed in the layer 1 output. This expansion in the amount of data required is indicated by the sloped dashed line in FIG. 6. Each Tile is delimited by solid lines, in this drawing.

Next, we consider which data in the layer 0 output is necessary to calculate $Tile_1$ in the layer 1 output. We will assume, for the sake of variety, that the stride in layer 1 is greater than 1. This means that the layer 1 output is smaller than the layer 0 output. There is a block, $Tile_1$, in layer 0, which corresponds to $Tile_1$ in layer 1. Since the kernel size is again greater than 1; there is a further growth in the amount of data required at the boundary. $Tile_1$ in the layer 0 output is therefore larger than $Tile_1$ in the layer 1 output.

The same happens when looking back from layer 0 to the input data. There is a block, $Tile_1$, in the input data, corresponding to $Tile_1$ in layer 0. We assume that the stride in layer 0 is 1; therefore, the input data is approximately the same size as the layer 0 output (subject to padding). Again, additional data is needed at the boundary, due to the kernel size being greater than 1. Thus, $Tile_1$ in the input data is larger again than $Tile_1$ in the layer 0 output. $Tile_1$ in the input data makes up the first subset (block 1) of input data. $Tile_1$ in the output data of the end layer makes up the output block.

Figure 6:
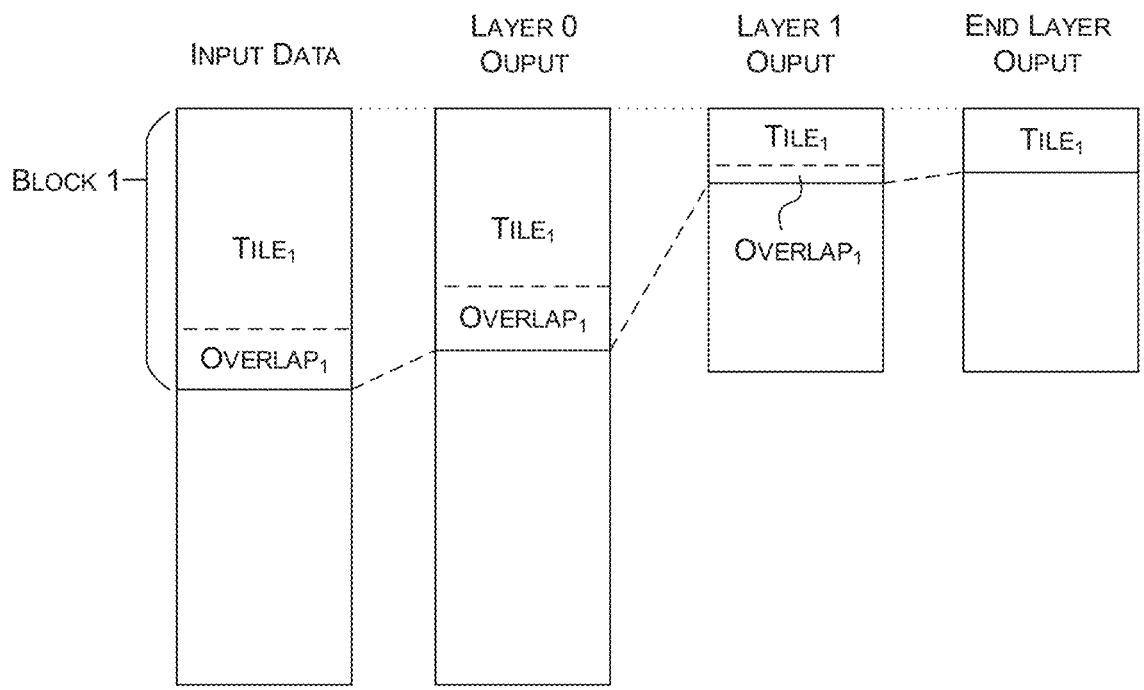
FIG. 6 illustrates the data dependency within a plurality of layers of a DNN, for a first block of data.

As can be deduced from the above, the total amount of data needed for the first tile grows successively from the end block back to the input block. It depends on the parameters (kernel size, stride, dilation) of all the intervening layers. Also indicated in FIG. 6 is the "Overlap". This is data that can be reused in a subsequent pass—that is, reused when calculating a subsequent Tile. The Overlap data is indicated by the dashed horizontal lines in each layer of data. $Overlap_1$ in the layer 1 output is the portion of $Tile_1$ that can be (re)used in calculating a subsequent block ($Tile_2$) of the end layer output. $Overlap_1$ in the layer 0 output is the portion of $Tile_1$ that can be (re)used in calculating $Tile_2$ of the layer 1 output. The size of the Overlap depends on the parameters (kernel size, dilation) of the next layer only. For example, if the stride=1 and dilation=1, the size of the Overlap (number of rows of Overlap) is given by the kernel size minus 1.

Figure 7:
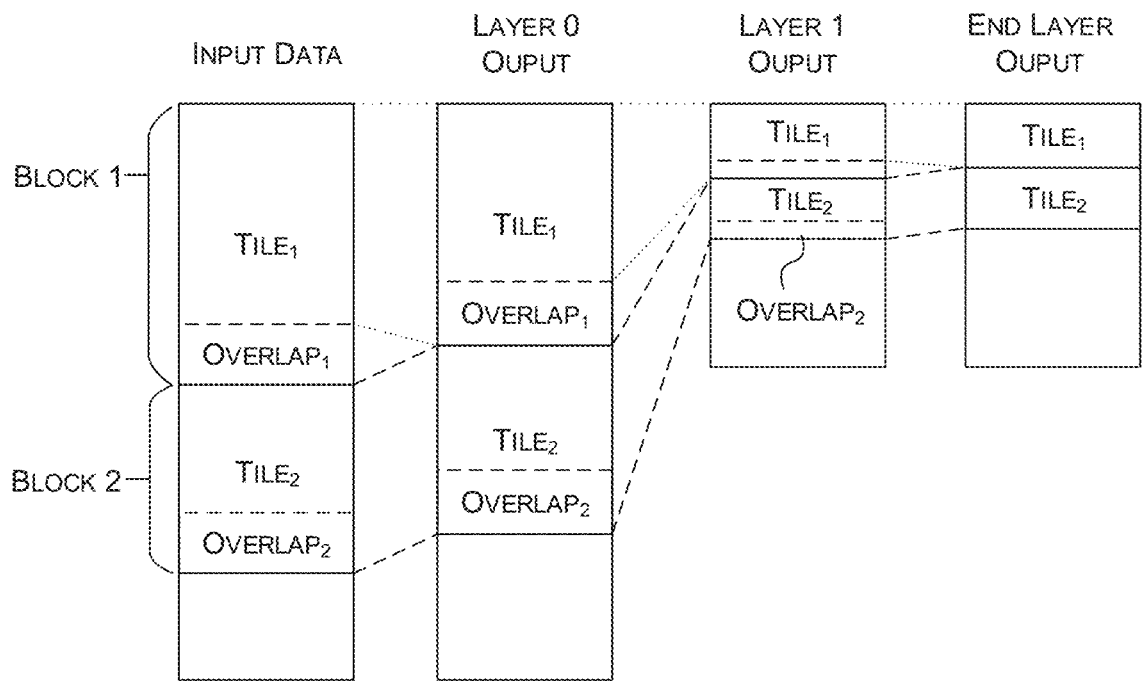
FIG. 7 illustrates the data dependency within the plurality of layers of FIG. 6, for a second block of data.

Following on from FIG. 6, FIG. 7 illustrates the data dependency for a second block. The second block ($Tile_2$) of output data of the end layer, is adjacent to the first block ($Tile_1$). Just like $Tile_1$, $Tile_2$ depends on amounts of intermediate data (and ultimately input data) that increase as we progress backwards through the layers. However, some of this data is common with the dependency of $Tile_1$ in the output data of the end layer. In particular, $Overlap_1$ in the output of layer 1 has already been calculated when evaluating layer 1 for Block 1 ($Tile_1$). The only additional data that needs to be calculated is the block $Tile_2$ in layer 1.

Likewise, moving backwards to the layer 0 output, the only additional data that needs to be calculated is the block $Tile_2$ in layer 0. Finally, moving backwards to the input data, the only additional input data that needs to be read from memory is Block 2 ($Tile_2$). As in FIG. 6, each Tile in FIG. 7 is delimited by solid lines. The Overlap data is delimited by dashed lines. The dotted lines indicate the uppermost extremity of the data dependency (that is, the first row of data needed to calculate the Tile in the next layer). The sloped dashed lines indicate the lowermost extremity of the data dependency (that is the last row of data needed to calculate the Tile in the next layer). Thus, for example, $Tile_2$ in the layer 1 output depends on $Overlap_1$ and $Tile_2$ in the layer 0 output. $Tile_2$ incorporates $Overlap_2$, which will be reused in the next pass to calculate $Tile_3$ of the subsequent layer, and so on. Note that, provided the Overlap data from the first pass is retained, the amount of "fresh" data needed for $Tile_2$ does not increase as we step backwards through the layers (except to the extent dictated by strides greater than 1). The same is true for all subsequent passes (Tiles), after $Tile_2$. In other words, for all passes after the first pass (operating on the leading Tile), a smaller amount of input data needs to be retrieved from memory, and smaller amounts of intermediate data need to be calculated at each layer.

This leads us to an important observation: the Overlap data constitutes a non-disposable portion of the data. The remainder of each Tile constitutes a disposable portion of the data. By this, we mean that the Overlap data is needed not only for calculating output data for the end layer for the current block but will also be needed later, for calculating output data for the end layer for a subsequent block (subsequent Tile). In contrast, the remainder of the data in each Tile is needed for calculating output data for the end layer for a current block, but it can be deleted/overwritten after that.

Figure 8:
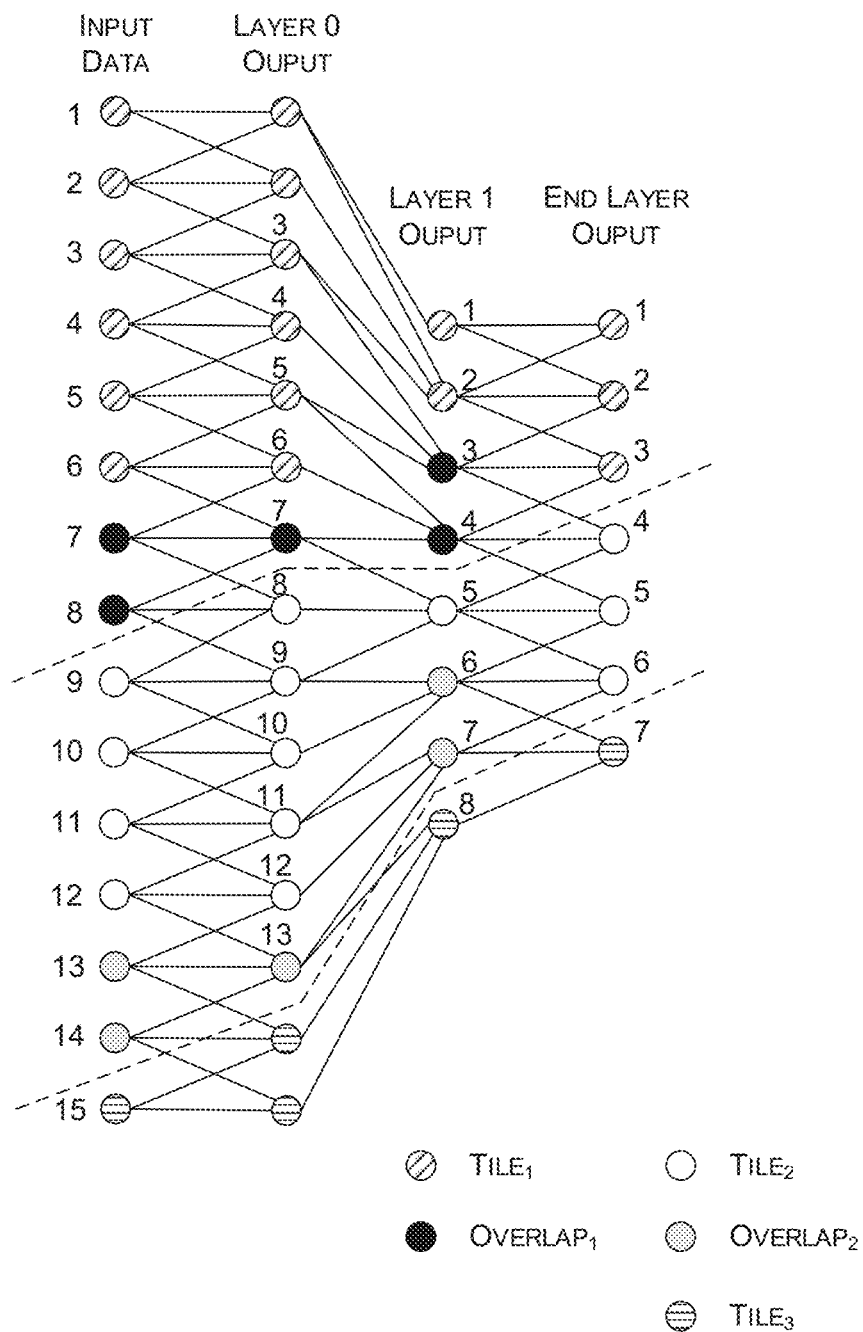
FIG. 8 is a conceptual illustration of the concept of overlap-data.

To consider this in detail for a simplified one-dimensional example, reference is made to FIG. 8. The diagram in FIG. 8 illustrates individual data elements in the input data and the output data of each of three layers of a neural network (layer 0, layer 1, and an end layer). Each circle represents a data element (which could be, for example, a pixel in an image or feature map). Each element depends on a certain sub-group of elements in the preceding layer. The connecting lines in FIG. 8 indicate the elements of the preceding layer upon which a given element depends. Thus, for example, the $3^{rd}$ element in the output of the end layer depends on the $2^{nd}$, $3^{rd}$ and $4^{th}$ elements in the output of layer 1. The fourth element in the output of the end layer depends on the $3^{rd}$, $4^{th}$ and 5th elements in the layer 1 output. In other words, in this example, the end layer has a kernel size of 3 and a stride of 1. Layer 1 has a kernel size of 3 and a stride of 2. Layer 0 has a kernel size of 3 and a stride of 1. Because layer 0 and the end layer each have a stride of 1, the output of layer 0 is approximately the same size as the input data, and the output of the end layer is approximately the same size as the output of layer 1 (subject to the need for padding). Meanwhile, because layer 1 has a stride of 2, the output of layer 1 is approximately half the size of the output of layer 0. The dashed lines represent the boundaries between blocks (Tiles). That is, the $3^{rd}$ data element shown in the end layer is the final data element of the first block ($Tile_1$). Taking the 4th element in the end layer output as an example, it can be seen that each element in the end layer output depends on: 3 elements in the output of layer 1; 7 elements in the output of layer 0; and 9 elements in the input data. Elements in $Tile_1$, other than the $Overlap_1$ elements, are shown with diagonal hatching. Three such elements (1-3) are shown, by way of example, in the end layer output.

Because of the data dependency, some elements can be discarded after the end layer output for the current block ($Tile_1$) has been calculated. These are referred to as "disposable" elements. Some other elements will be used also for calculating the end layer output for the next block ($Tile_2$). These are referred to as "non-disposable" elements. In particular, the $Overlap_1$ elements (coloured solid black in FIG. 8) are non-disposable elements. Elements 7 and 8 in the input data are used to calculate elements 6 and 7 in the output of layer 0, during the first pass through the plurality of layers, to calculate the end layer output data for the current block ($Tile_1$). However, they are also needed to calculate elements 8 and 9 in the layer 0 output. These elements 8 and 9 are not needed in the first pass for calculating the first block, but they will be needed in the second pass for calculating the second block. Consequently, to minimise memory access overhead, it is desirable to retain elements 7 and 8 of the input data in the on-chip memory 314, to avoid the need to read them again from the DDR 312 in the second pass. Element 7 in the layer 0 output and elements 3 and 4 in the layer 1 output are also $Overlap_1$ elements, since they will also be needed for calculations in the second pass (element 7 in the layer 0 output will be needed to calculate element 5 in the layer 1 output; and elements 3 and 4 in the layer 1 output will be needed to calculate elements 4 and 5 in the end layer output).

Now consider the remaining elements of $Tile_1$, shown with diagonal hatching in FIG. 8. Element 6 of the input data is used in the calculation of elements 5, 6, and 7 of the layer 0 output. However, each of these three elements must be calculated in the first pass, for calculating the first output block ($Tile_1$). Element 6 of the input data is not needed for any additional calculations in the second pass; therefore, it is "disposable" data. Similarly, element 6 in the layer 0 output is used to calculate element 4 in the layer 1 output, but is not needed further in the second pass (provided that element 4 in the layer 1 output is retained). Elements of $Tile_2$ (other than the $Overlap_2$ elements) are shown as empty circles. $Overlap_2$ elements are shown shaded in grey. These will be reused in the calculation of $Tile_3$ and are therefore non-disposable data. A few $Tile_3$ elements are shown at the bottom of the drawing, with horizontal hatching.

The present inventors have recognised that the disposable data, is only required for calculating the next layer, in the present pass through the plurality of layers. Once the next layer in the present pass has been calculated, the disposable data from the preceding layer can be deleted/overwritten. The non-disposable data (Overlap) must be retained, for all layers of the present pass, in order that it can be used in the second pass, for calculation of the second block. This recognition can enable a reduction in unnecessary read/write operations from/to the DDR 314, and also a reduction in unnecessary re-calculation of intermediate output data.

Figure 9:
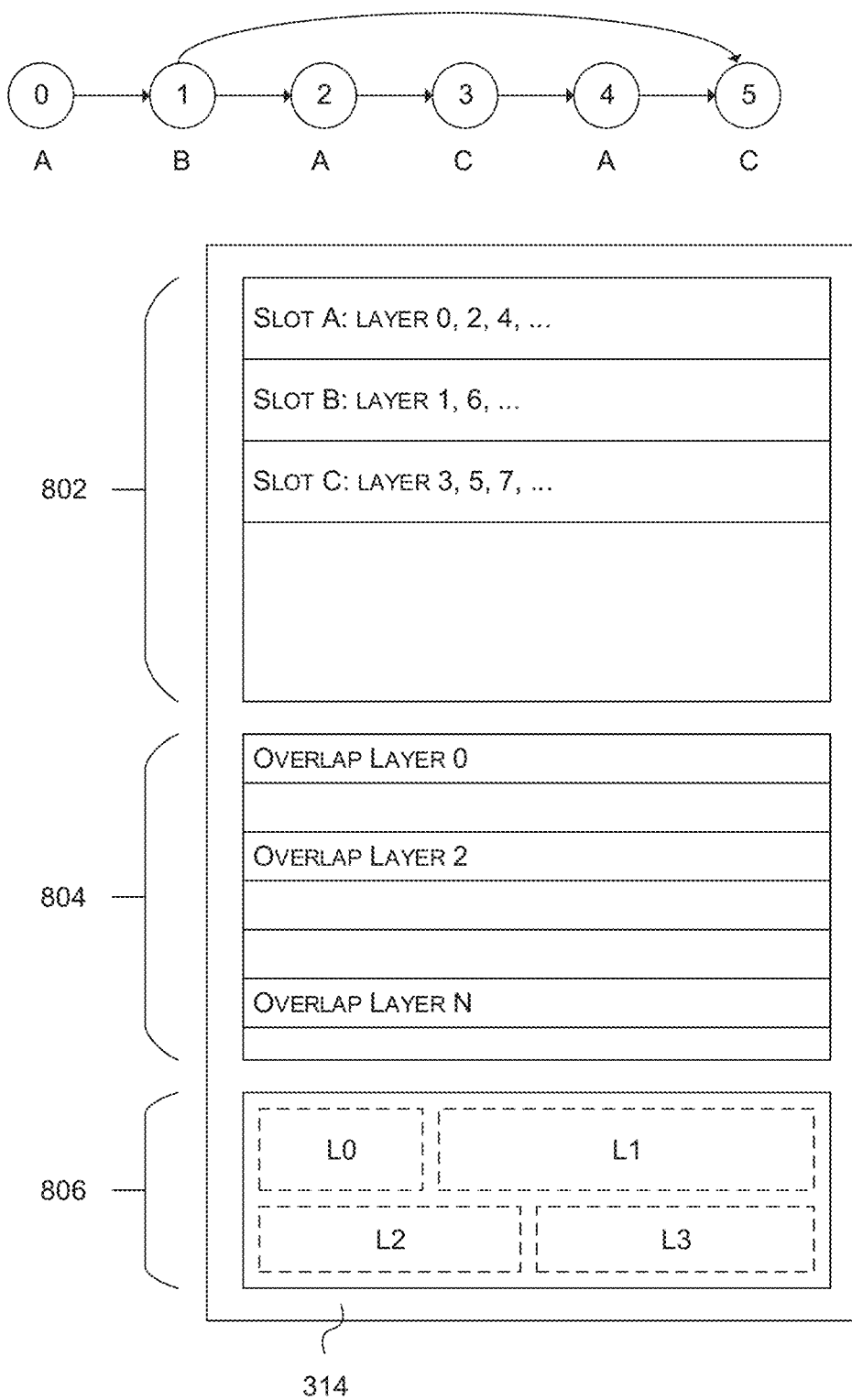
FIG. 9 schematically illustrates an example allocation of memory associated with a hardware implementation of a DNN.

A memory management strategy according to one example of the hardware implementation will now be explained with reference to FIG. 9. The inventors have recognised that the disposable data is relatively large, but valid for a short period of time. Conversely, the non-disposable data (Overlap) is relatively small, but valid for the whole pass. FIG. 9 illustrates one example memory allocation for the on-chip memory 314 that exploits these characteristics. In this example, we assume that six layers (numbered 0, 1, 2, 3, 4, 5) of a neural network are to be processed together. Each layer is connected to its preceding layer, in one branch. In a second branch, layer 5 is connected to layer 1. This means that the output data of layer 1 is part of the input data to layer 5.

The memory management strategy divides the on-chip memory 314 into three sections. The first section 802 (which may be referred to as "swap" memory) is used for storing the disposable data. The second section 804 (which may be referred to as "heap" memory) is used for storing the non-disposable data. The third section 806 (coefficient memory) is used for storing the weight data for the various layers. Within the first section 802, a plurality of slots A, B, C are defined. Within a given pass (to calculate a given block of output data) the method proceeds as follows. The disposable output of layer 0 is written to slot A. The non-disposable output of layer 0 is written to the start of the second section 804. Before evaluating layer 1, the data is read from these two locations. During the evaluation of layer 1, the disposable output of layer 1 is written to slot B and the non-disposable output of layer 1 is written to the second section 804—for example, appended to the non-disposable output of layer 0. At this point, the disposable data from layer 0 is no longer needed. Consequently, during the evaluation of layer 2, the contents of slot A can be overwritten with the disposable output of layer 2. The non-disposable output of layer 2 is once again appended to the data in the second section 804. However, when evaluating layer 3, neither slot B nor slot A should be overwritten. The contents of slot B (disposable output of layer 1) are needed again for the evaluation of layer 5, because of the branching. And, of course, the contents of slot A are needed immediately for the evaluation of the current layer (layer 3). Accordingly, the disposable output of layer 3 is written to slot C. The disposable output of layer 4 is written to slot A, once again overwriting the contents of that slot, which are no longer needed for further calculations. In order to evaluate layer 5, the disposable output data from layer 1 is read from slot B, and the disposable output data from layer 4 is read from slot A. (The non-disposable output data from layers 1 and 4 is read from the second section 804.)

In this way, the slots used to store the disposable data are reused frequently within a given pass, thereby helping to reduce the total amount of the on-chip memory 314 that is occupied at any given instant. The size of each slot can be chosen based on the maximum size of disposable data to be stored in that slot during a pass. Note that the second section 804 is double buffered, in this example. The non-disposable output data (Overlap) for all layers of the current block is stored in one set of memory locations. In the next pass (to calculate the next block), the Overlap is retrieved from this set of memory locations, as needed. The Overlap for the next block is stored in a second set of memory locations. For subsequent passes (subsequent blocks) the hardware implementation alternates between using the first set and the second set of memory locations—reading from one set while writing to the other set.

The disposable and non-disposable portions of the data can be identified by analysing the structure of each layer of the plurality of layers. Similarly, the allocation of the disposable data of each layer to a particular slot in the first section 802 of the on-chip memory 314 can be done by analysing the overall layer structure of the plurality of layers. This analysis can be conducted by software, either dynamically at runtime or when mapping a given neural network to a given hardware implementation. Alternatively, it may be defined manually by a designer of the hardware implementation. However, the use of software facilitates the mapping of a variety of different neural networks to a given hardware implementation.

Figure 10:
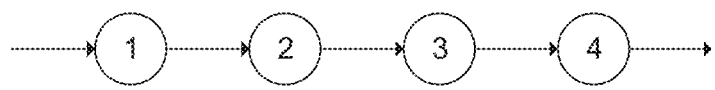
FIG. 10 illustrates a DNN with four layers and no branching.

As mentioned previously above, the plurality of layers of the neural network that are evaluated together in each pass (also referred to herein as a "Tile Group") could include all layers of the neural network, but this is not essential. The plurality of layers may consist of a subset of the layers of the overall neural network. Depending on the structure of the neural network, different groupings of layers may be found advantageous. FIG. 10 shows a simple neural network consisting of four layers, with no branches and each layer simply depending on the output of the preceding layer. This leads to a large degree of freedom in the choice of how to group the layers together. For example, the layers could be grouped into one or more pluralities of layers according to any of the following grouping strategies:

1-4
1-2, followed by 3-4
1-2, followed by 3, followed by 4
1-3, followed by 4
1, followed by 2-4
1, followed by 2-3, followed by 4
1, followed by 2, followed by 3-4

In general, there may be a preference to group as many layers as possible together, subject to the constraint of the size of the-chip memory 314.

Figure 11A:
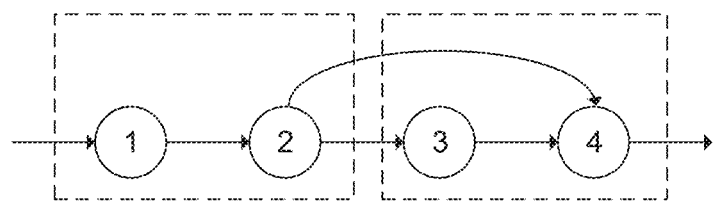
FIG. 11A illustrates an example grouping of layers for a DNN with four layers, having branching.
Figure 11B:
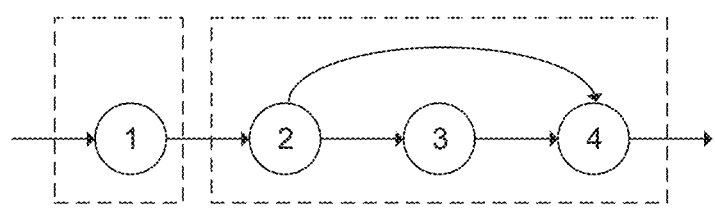
FIG. 11B illustrates an alternative example grouping, for the DNN of FIG. 11A.

FIG. 11A shows a slightly more complex network structure. Again, there are four layers, with each layer depending on the preceding layer. However, there is an additional branch from layer 2 to layer 4. In FIG. 11A, the network is split into two pluralities of two layers each (layers 1-2 and 3-4), indicated by the dashed boxes in the drawing. Note, however, that this might not be optimal in terms of memory access requirements. The output of layers 1-2 will be written to the DDR 312. This will be read from the DDR 312 when evaluating layer 3 (the first layer of layers 3-4); however, the output of layer 2 is also needed for the evaluation of layer 4. Therefore, the same data will have to be read a second time from the DDR 312 in order to evaluate layer 4. In contrast, FIG. 11B shows an alternative grouping of the layers, which may be more efficient in terms of memory access requirements. Here, layer 1 is processed by itself, and layers 2-4 are grouped into a plurality of layers. By doing this, both of the branches are captured within the plurality of layers. The output data of layer 1 will be read once from the DDR 312, as input data for the first layer (layer 2) of the plurality of layers. The output data of layer 2 can be handled within the plurality of layers, using the memory management strategy described above with reference to FIG. 9.

At the outset, referring to FIG. 2 above, the example was given of a convolutional layer of a neural network, operating on two-dimensional (2D) image data in a plurality of p planes or feature maps. However, it will be understood that the present disclosure is not limited in this way. The principles described above can be applied to 1D, 2D or higher dimensional data. When applied to 2D (or higher dimensional) data, the blocks (tiles) of input and output data can be constructed in a variety of ways. Each block can be defined in one, two, or more dimensions. For example, for 2D image data, a block defined in one dimension may form a 2D stripe (in a horizontal or vertical direction). The overlap data may be defined above and below the stripe (for a horizontal stripe) or to the left and right of the stripe (for a vertical stripe). The diagrams of FIGS. 5, 6, and 7 are drawn with this in mind. (They are also applicable to 1D blocks defined in 1D data.) It will be understood that, although FIGS. 5-8 indicate data being split into blocks in the Y (height) dimension, this is non-limiting. As explained above, the same methodology can be applied in the X (width) dimension. Nevertheless, there may be a preference for splitting in one dimension versus another dimension, in some cases. For example, if the data is stored row-wise in memory, and the individual data elements do not align neatly with a burst size used to read/write the memory, then it may be preferable to split the tiles in the Y (height) dimension.

Alternatively, for 2D image data, a block may be defined in two dimensions, forming a 2D rectangle of data. The overlap data may then be defined above, below, to the left, and to the right of this rectangle. The overlap data from a current block may be useful for calculating multiple subsequent blocks of output data—for example, a block to the right of, a block below, and a block below-right of the current block (assuming blocks are processed in raster-scan order). The same principles can likewise be extended to blocks in a higher number of dimensions, with overlap data in multiple directions in the multidimensional space.

In the examples above, the depth-first processing of the neural network, in tiles, was discussed in terms of individual layers of the network. This is appropriate for the implementation 300 of FIG. 3, which is designed primarily to process a single convolutional layer. However, it is also possible to provide more elaborate hardware implementations, which add additional processing modules to the implementation 300, and thereby enable multiple layers to be processed in a single pass through the hardware implementation. For instance, a pooling module, element-wise operations module, normalisation module, and activation module can be provided (see GB 2566702 A, for example). This could allow—for example—a convolutional layer, followed by an activation function, followed by a pooling operation, to be carried out in a single pass through the hardware implementation. In some cases, data may be passed from one layer/operation to the next in a pipelined fashion, without needing to write it to the on-chip memory. When the hardware implementation is capable of multiple sequential operations like this, in a single hardware-pass, it makes sense to group together the layers that are processed together by the hardware. To accommodate this, the concept of a "layer group" is introduced. A layer group is a group of layers that can be processed together by the hardware implementation, in a single pass through the hardware. A layer group may consist of a single layer (as in the examples described above with reference to FIG. 3); however, where the hardware has the necessary capabilities, a layer group may consist of more than one layer.

Figure 12:
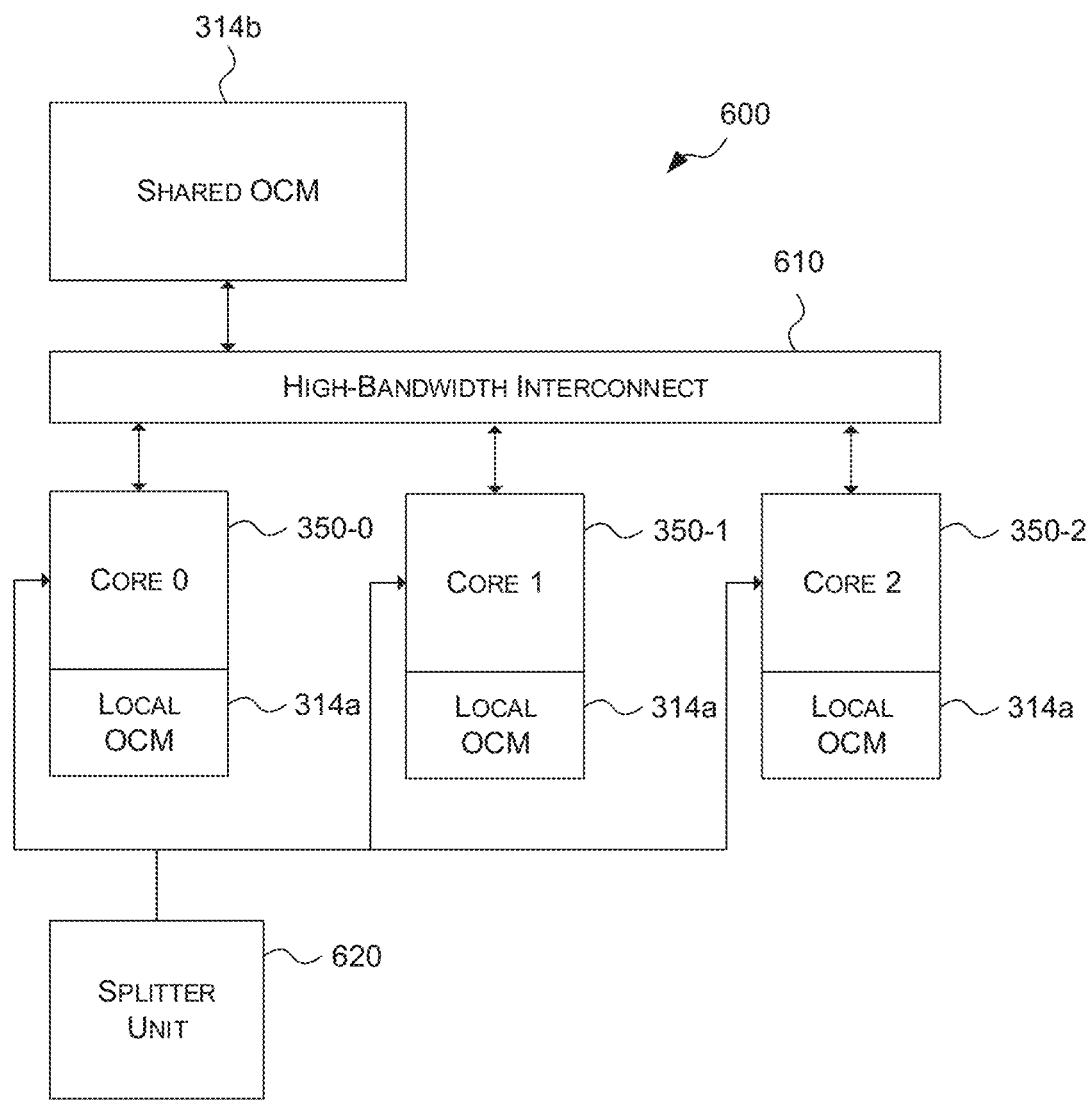
FIG. 12 is a block diagram of a multicore hardware implementation, according to an example.

Splitting data into tiles, as described above, can offer one way to facilitate a parallel, multicore implementation of a convolutional neural network. An example of a multicore implementation according to a first aspect will now be described, with reference to FIGS. 12-15. FIG. 12 shows a block diagram of the hardware implementation 600. It comprises three cores 350-0, 350-1, and 350-2. Each core has a respective local on chip memory (OCM) 314a, which is accessible only to that core. The hardware implementation 600 also comprises a shared on-chip memory 314b. All of the cores are able to access (that is, read from and write to) the shared OCM 314b via a high bandwidth interconnect 610. A splitter unit 620 is provided, which is configured to manage the division of work between the cores.

Figure 13:
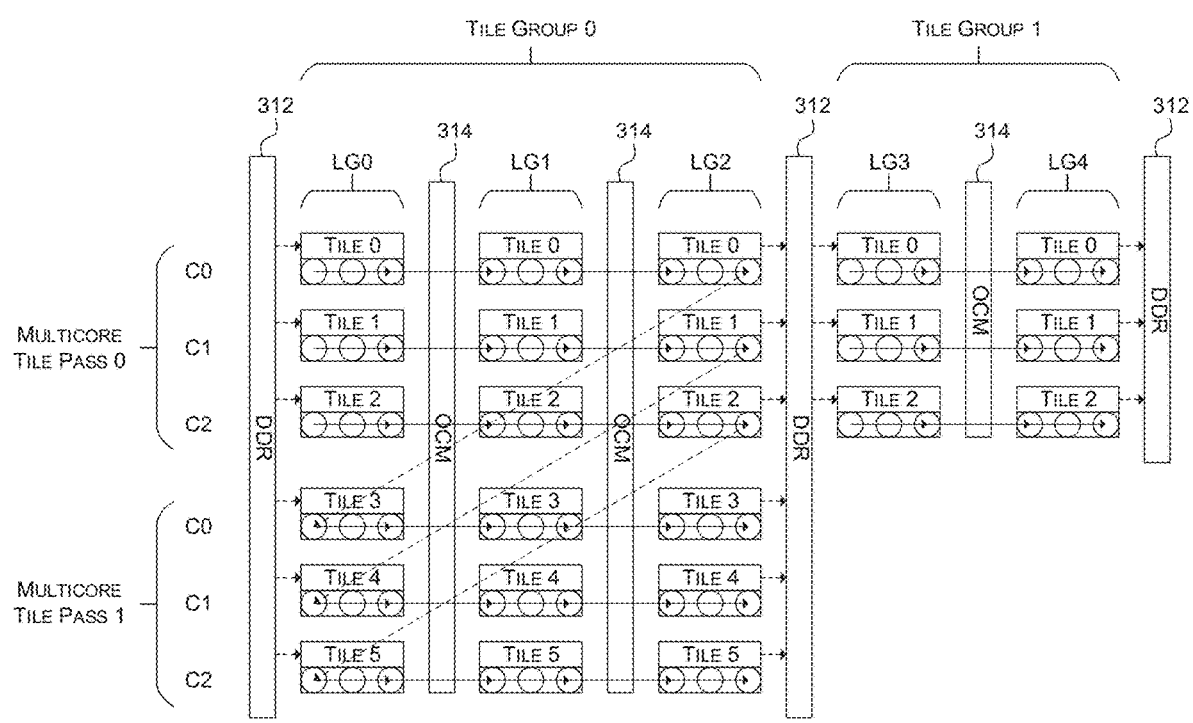
FIG. 13 illustrates an example of execution order in the multicore hardware of FIG. 12, when splitting input data into tiles and processing the tiles depth-first, according to a first aspect.

FIG. 13 illustrates schematically one example of processing tiles in a depth-first fashion, using the different cores 350 of the hardware implementation 600. The individual tiles are like those described previously above. In this example, the tiles are divided up along the Y-dimension of the input data tensor. This is convenient when the data is stored in memory row-first (that is, X-dimension first). As shown in the drawing, the neural network includes five layer groups (labelled LG0 to LG4). Each layer group is indicated as comprising three layers, denoted by the circles in the drawing. (It will be understood that this is not limiting—different layer groups can have different numbers of layers.) The layer groups are to be evaluated by the hardware implementation in two "tile groups" (labelled Tile Group 0 and Tile Group 1). A tile group consists of the set of layer groups that are to be evaluated depth-first together, after splitting the data into tiles. The input data for the first layer group in a tile group is read from the DDR 312, and the output data from the final layer group in the tile group is written to the DDR 312. Within a tile group, intermediate data (in tiles) is written to the OCM 314 by each layer group, and read from the OCM 314 by the next layer group. The intermediate data may be stored in part in the local OCMs 314a, and in part in the shared OCM 314b. This will be explained in greater detail below.

As shown in the drawing, in this example, the input data stored in the DDR 312 is split into six tiles (labelled Tile 0 to Tile 5) for the evaluation of Tile Group 0. There are only three cores 350; therefore, not all of the tiles can be processed in parallel, in this tile group. Instead, the first three tiles are allocated to the three cores, respectively, for a first multicore tile pass (Multicore Tile Pass 0). Here, a multicore tile pass means the evaluation of all of the layer groups of a tile group, for N successive tiles, where N is the number of cores. Tile Group 0 consists of the first three layer groups LG0-LG2. In Multicore Tile Pass 0, Core 0 evaluates the layer groups LG0-LG2 based on Tile 0; Core 1 evaluates the layer groups based on Tile 1; and Core 2 evaluates the layer groups based on Tile 2. This is indicated by the solid-lined arrows in FIG. 13. Next, as indicated by the dashed arrows, the hardware implementation 600 proceeds to Multicore Tile Pass 1, in which Core 0 evaluates the layer groups LG0-LG2 based on Tile 3; Core 1 evaluates the layer groups based on Tile 4; and Core 2 evaluates the layer groups based on Tile 5. This completes the evaluation of the first tile group. Note that FIG. 13 is primarily intended to illustrate the execution order of the tiles by the cores. It does not offer a detailed picture of which portions of data are stored in which memory. Further details will be provided below, with reference to FIG. 14, to explain how the data is arranged in the memories 312 and 314.

In each multicore tile pass, the output tiles of LG0 are written to the OCM 314, and read from the OCM 314 as input tiles for LG1. Similarly, the output tiles of LG1 are written to the OCM 314, and read from the OCM as input tiles for LG2. The output data of the first tile group—namely, the output tiles of LG2—are written to the DDR 312, before the hardware implementation 600 proceeds to evaluate Tile Group 1.

Tile Group 1 consists of two layer groups LG3-LG4. As shown, the data is split into just three tiles for this tile group. The number of tiles can be chosen based on the size of the input data to the tile group, dependent on the size on the OCM 314. The number of tiles may also be influenced by the number and configuration of the layers within the Tile Group, because these will affect the amount of data that needs to be stored in the OCM 314 during the evaluation of the tile group for each tile. Tile Group 1 can be evaluated in a single multicore tile pass, because the number of tiles is not greater than the number of cores. Core 0 evaluates the layer groups LG3-LG4 based on Tile 0; Core 1 evaluates the layer groups LG3-LG4 based on Tile 1; and Core 2 evaluates the layer groups LG3-LG4 based on Tile 2. The output tiles of LG3 are written to the OCM 314, and read from the OCM 314 as input tiles for LG4. The output tiles of LG4 are written to the DDR 312.

Figure 14A:
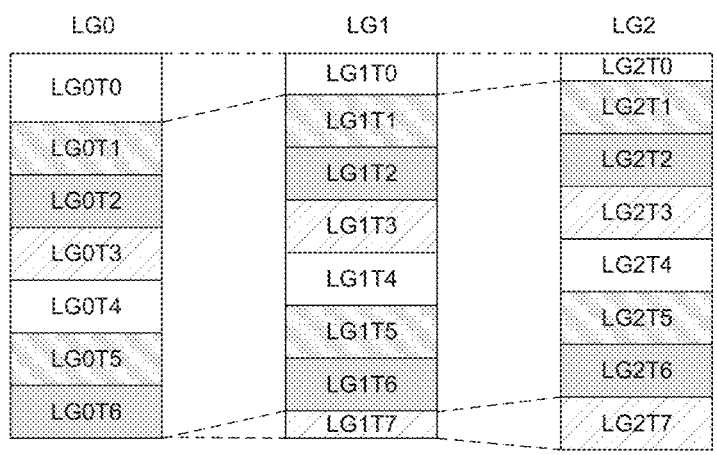
FIGS. 14A-14B illustrate synchronisation between cores, in another example in which input data is split into tiles and processed depth-first.
Figure 14B:
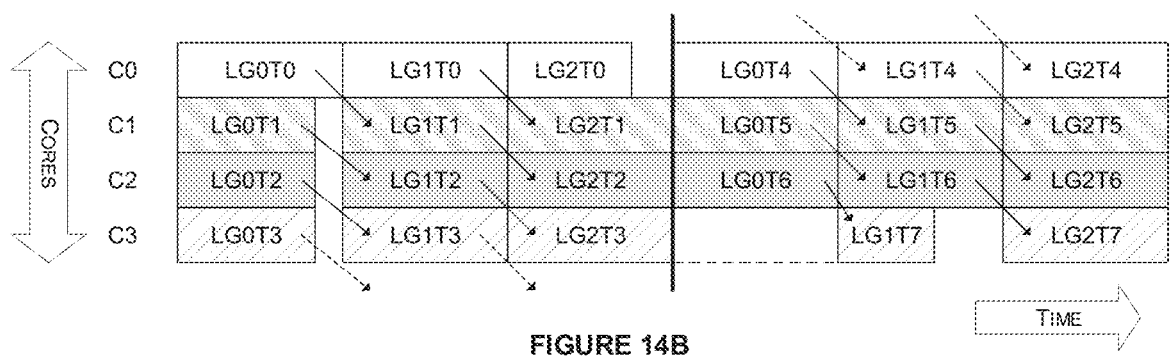

FIGS. 14A-14B illustrate (for a different example), how tiles may be allocated to and processed by multiple cores. FIG. 14A shows output data of three layer groups LG0-LG2, split into tiles. Here, the notation "LGxTn" means "Layer Group x, Tile n". As explained above with reference to FIG. 5, the sizes of the tiles in each layer are defined by the data-dependency in the neural network layers. Starting from the final layer group, the size of the leading tile expands from the leading output tile LG2T0 in the final layer group to the leading output tile LG1T0 in the middle layer group, and expands again to the leading output tile LG0T0 in the initial layer group LG0. In each layer group, subsequent tiles after the leading tile LGxT0 have uniform size, within that layer group—with the exception of the trailing tile. The trailing tile can shrink as one moves backwards through the layer groups from the final layer group to the initial layer group. This can be seen comparing the trailing tile LG2T7 of the final layer group with the trailing tile LG1T7 of the middle layer group. Moreover, the trailing tile LG1T7 "disappears" completely in the initial layer group, in the sense that there are only seven tiles, instead of eight, in this layer group.

The tiles are processed in a multicore architecture with four cores (C0-C3). In both FIG. 14A and FIG. 14B, the tiles are shaded/hatched according which core processes them. FIG. 14B shows how the layer groups are processed by the cores, over time, with arrows indicating data-dependencies between tiles. In the first multicore tile pass, the first four tiles are processed by the four cores C0-C3, respectively. In the first layer group, the leading tile LG0T0 is larger than the other tiles, and therefore core C0 takes longer to evaluate the layer group based on this tile than the other cores C1-C3 take to evaluate it based on the other tiles. In the present example, each core waits until all of the cores have finished evaluating the layer group. Thus, cores C1-03 wait for C0 to finish the leading tile LG0T0. This provides a simple but effective way to achieve synchronisation between the cores. After the evaluation of the first layer group, all four cores continue with the evaluation of the second layer group, followed by the evaluation of the third layer group. As can be seen in FIG. 14B, in the evaluation of the final layer group in this multicore tile pass, the evaluation of the leading tile LG2T0 is quicker than the other tiles. This is because the leading tile LG2T0 has been selected to be smaller than subsequent tiles LG2T1-LG2T7. This is done in order to avoid that the leading tile grows too large in the initial layer. The aim is to try to balance the division of labour between the cores, and to try to avoid that a core finishes its work significantly earlier or later than any of the others.

As explained above with reference to FIGS. 7 and 8, the evaluation of a layer group for a given tile (other than the leading tile) depends on the overlap data of the preceding output tile in the preceding layer group. For example, the evaluation of LG1T1 depends on both LG0T1 and LG0T0. Likewise, the evaluation of LG1T2 depends on LG0T2 and LG0T1, and so on. This dependency between tiles within a multicore tile pass is shown by the solid arrows in FIG. 14B. The dependency means that each core needs access to overlap data that was produced by another of the cores. To facilitate this, the overlap (non-disposable) data of each tile is stored in the shared OCM 314*b*. The remainder of the data (that is, the disposable data) can be stored in the local OCM 314*a* of each core, because no other core needs to access it. This can avoid the need for each core to recalculate the overlap data, while also avoiding the costly overhead that may be involved in writing the overlap data to the DDR 312. Meanwhile, the local OCM 314*a* may be less costly to access than the shared OCM 314*b*, providing improved efficiency compared with an implementation that stores all of the data in a shared OCM.

Note that it is in principle not necessary for every core to wait for all the cores to complete a layer group. For example, in principle, the evaluation of LG1T2 could start as soon as LG0T1 and LG0T2 are finished. Similarly, the evaluation of LG1T0 could start at any time (that is, an indeterminate amount of time) after the evaluation of LG0T0 completes. This kind of "free-running" approach can indeed be adopted in some other implementations. However, the present implementation has the benefit of simplicity, as it avoids the added complexity necessary to keep track of the free-running.

The end of the first multicore tile pass is indicated by the thick black vertical line in FIG. 14B. Next, the cores proceed with a second multicore tile pass, to evaluate the layer groups based on the remaining tiles. There are a few points to note about the second multicore tile pass. For the second and third layer groups LG1-LG2, it will be understood that the fifth tile depends on overlap data that was produced when evaluating the fourth tile in the previous multicore tile pass. In other words, although the overlap data from LG0T0, LG0T1 and LG0T2 is used by the cores "immediately", in the evaluation of LG1T1, LG1T2 and LG1T3, respectively, the overlap data from LG0T3 needs to be retained in the shared OCM 314*b* until the second multicore tile pass, when it is used by core C0 in the evaluation of LG1T4. Similarly, the overlap data from LG1T3 is retained in the shared OCM 314*b* until it is used by core C0 in the evaluation of LG2T4. These dependencies, between tiles that are processed in different multicore tile passes, are shown by the dashed arrows in FIG. 14B. Another point to note is that the evaluation of the second layer group based on the trailing tile LG1T7 is quicker to complete than the other tiles in that layer group. This is because of the small size of the tile, which shrinks compared with the trailing tile of the final layer group LG2T7 (see FIG. 14A). Moreover, core C3 is idle during the evaluation of LG0, in the second multicore tile pass, because there are only seven tiles for this layer group. It will be understood that the dependencies between the tiles, and the consequential need for synchronisation between the cores, arises because of the overlap at the boundaries between tiles. In cases for which there is no overlap (for example, a series of convolutions with 1×1×1 kernels), there is no need for synchronisation, and the cores can be allowed to free-run (without any complexity penalty). In general, for convolution, the formula for determining the size of any overlap in the Y-dimension is: overlap=max(0, (kernel height−1)*dilation height−(stride height−1)).

The method will be described in greater detail with reference to FIG. 15. In step 710, ▇ splitter unit 620 defines the plurality of layer groups and arranges them in tile groups. The arrangement in tile groups can be done as described above with reference to FIGS. 10-11B. In step 712, the input data for the first layer group is provided in the DDR 312. In step 714, the splitter unit 620 analyses the input data for the first layer group. In particular, it checks whether the size of the input data in the Y-dimension is above a threshold. If so, it determines (step 716) that the input data can be split along the Y-dimension into tiles. In other words, the input data will be split into tiles if it is of a sufficiently large size in the Y-dimension. In response to the determination in step 716, the splitter unit splits the data into tiles (step 718) and allocates each tile to one of the available cores (step 719). If there are more tiles than cores, then the splitter unit 620 will control the cores to carry out several multicore tile passes. In general, the splitter unit tries to split the input data into tiles in such a way that all cores are occupied. Therefore it may try (where possible) to split the input data into a number of tiles that is an integer multiple of the number of cores. The number of tiles (and number of multicore tile passes) will be influenced by the capacity of the OCM 314.

In step 720, at least two cores evaluate the first layer group based at least two respective tiles. That is, each core evaluates the first layer group based on one tile. The splitter unit is configured to identify a disposable portion and a non-disposable (overlap) portion of each output tile. It instructs the cores to store these different portions in different places. Thus, the first core 350-0 writes the disposable portion of a first output tile to its local OCM 314a (step 722) and writes the overlap portion of the first output tile to the shared OCM 314b (step 724). Meanwhile, the second core 350-1 writes the disposable portion of a second output tile to its local OCM 314a (step 722), and writes the overlap portion of the second output tile to the shared OCM 314b (step 724). Only two instances of steps 720-724 are shown in the flowchart, implying the presence of two cores; however, it will be understood that there are as many parallel instances of these steps as there are cores occupied with the evaluation. Note that step 722 and 724 may also be performed in the opposite order or in parallel.

In step 728, any core that has finished its evaluation ahead of the others waits for all of the cores to finish their evaluation of the first layer group before proceeding. The method proceeds to step 730. If there are further layer groups in the current tile group, each core moves on to evaluate the next layer group based on its tile. When evaluating the second and subsequent layer groups, each core reads the necessary disposable data from the preceding layer group from its own local OCM 314a, and reads the necessary overlap data from the preceding layer group from the shared OCM 314b.

This loop continues until all of the layer groups of the current tile group have been evaluated by each core, based on a respective tile. When (in step 730) there are no further layer groups in the current tile group, the method proceeds to step 732, checking whether there are further tiles to be processed. This represents the end of one multicore tile pass. If there are further tiles to be processed, the cores proceed with a second multicore tile pass, in order to evaluate all of the layer groups of the current tile group for the next set of tiles. The method continues looping over multicore tile passes until all of the tiles have been processed. Then, in step 732, when there are no more tiles to be processed, the evaluation of the tile group is complete and the method ends. The method may be repeated for subsequent tile groups, as necessary.

It will be noted that, in steps 714 and 716, the splitter unit 620 determined that the input data could be split into tiles based on the size of the input data (in particular, in the Y-dimension). The splitting into tiles depends on the tensor size being large enough. However, it would be advantageous to be able to split the processing across multiple cores even for relatively small tensors. According to a second aspect, a method is provided for doing this. An example of the method will now be described with reference to FIGS. 12, 16, and 17. According to this example, the evaluation can be split across cores along one of the other dimensions. This may include spitting the evaluation of a layer group along the X-dimension, which is one of the traversed dimensions. Equally, it may include splitting the evaluation of a layer group across one of the non-traversed dimensions—in particular, splitting across input channels, C, or splitting across output channels, F. Generally, when splitting the evaluation into passes, the input data for the layer group is not split up between the cores—it is stored in the shared OCM 314b and accessed from there by each of the cores 350. This is a distinction from the use of tiles in the first aspect (as exemplified in FIGS. 13-15), in which both the data and the evaluation are split up among the cores. When splitting along the C-dimension, each core evaluates the layer group for a respective channel (or set of channels) of the input data. When splitting along the F-dimension, each core evaluates the layer group for a respective filter (or set of filters), producing a respective output channel, or set of output channels. When splitting along the X-dimension, each core evaluates the layer group for a respective column (or set of columns) of the input data.

Figure 16:
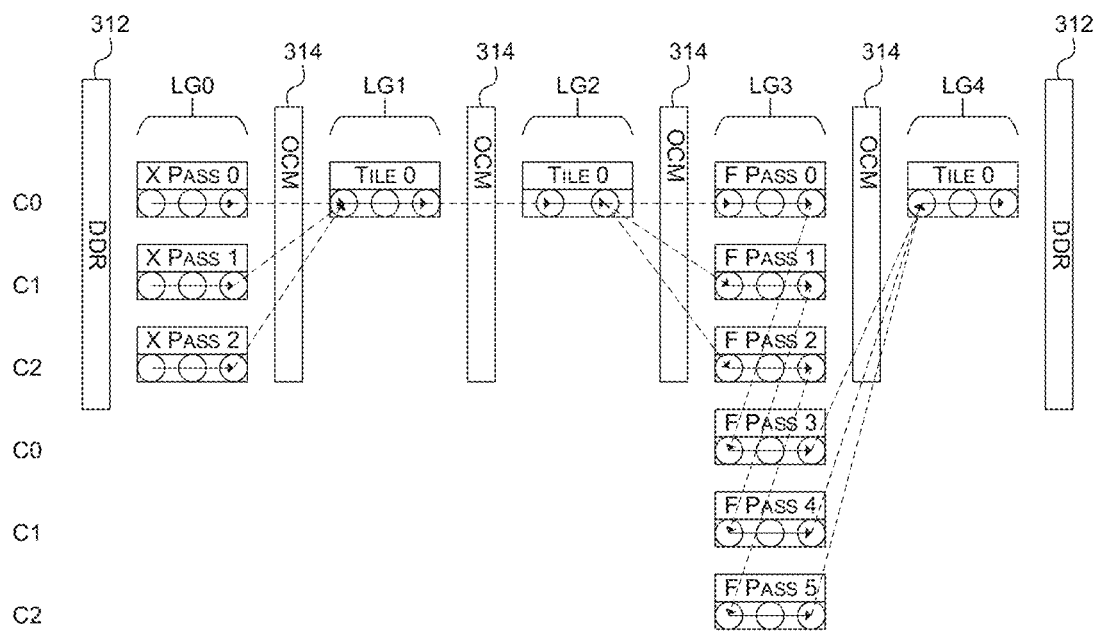
FIG. 16 illustrates an example of execution order, when splitting the evaluation of layers into passes, according to a second aspect.

FIG. 16 illustrates schematically an example of splitting the evaluation of a plurality of layer groups into multiple passes, split across multiple cores, evaluating one layer group at a time. There are five layer groups LG0-LG4. Layer group LG2 comprises two layers; the other layer groups comprise three layers each. The input data for the first layer group is stored in the DDR 312. In this example, the first layer group LG0 is split into three passes, to be evaluated by different cores. The division is along the X-dimension. Each of the three cores C0-C2 evaluates a respective one of the three passes. In each pass, the respective core processes a portion of the input data to produce a portion of the output data. In this example, it is assumed that there is at most one convolutional layer in each layer group. Therefore, the problem of overlap data does not arise. Depending on kernel size and stride, the different cores may access overlapping portions of the input data, but they generate distinct portions of the output data. Unlike the case for FIG. 13, the data is not split into separate tiles in this example. (It would be difficult to do this in the X-dimension, in the current example, because the data is arranged row-first and the data elements in the X-dimension do not line up with bursts of data in the memory.) Instead each core accesses the portion of data it needs from the shared OCM 314b. As noted already, each core generates a respective portion of output data. When all the cores have evaluated the first layer group, the portions of output data are combined in the OCM 314.

The next two layer groups LG1-LG2 are not split; therefore, each is evaluated in a single pass by one core. The following layer group LG3 is split into six passes across output channels (the F-dimension). As there are more passes here than cores, the cores C0-C2 firstly evaluate the layer group for the first three passes in the F-dimension (labelled 0, 1, and 2 in the diagram). Then, the cores C0-C2 evaluate the layer group for the second set of three passes (labelled 3, 4, and 5, in the diagram), to complete the layer group. The final layer group LG4 is again processed in a single pass by core C0. The output of the first four layer groups LG0-LG3 is combined in the OCM 314; the output of the final layer group LG4 is written to the DDR 312.

As shown by this example, the splitting is flexible, in that different layer groups can be split up along different dimensions (compare LG0 with LG3, for example). This is achieved by combing the complete output of each layer group in the OCM 314, which makes the splitting of one layer group independent of the splitting of the other layer groups. This is another distinction from the tiled-based splitting of FIG. 13, in which each core operates on a specific tile and the correspondence between tiles is preserved as the layer groups of a tile group are evaluated depth-first.

The method will be described in greater detail with reference to FIG. 17. Steps that are similar to the steps in FIG. 15 will be given like reference numerals. In step 710', the splitter unit 620 defines the plurality of layer groups. In step 712', the input data for the first layer group is provided in the DDR 312. In step 714', the splitter unit 620 analyses the input data, to check whether it can be split into tiles. In particular, the splitter unit checks whether the size of the input data in the Y dimension is above a threshold. In step 746, the splitter unit 620 determines that the size is not above the threshold—therefore, the data is not suitable for tiling. In response to this determination, the splitter unit 620 splits the evaluation of the layer group into passes (step 748), and allocates each pass to a core (step 749). The cores evaluate the layer group for their respective passes, to generate respective portions of output data, in step 750. If it is determined, in step 752, that there are further passes to complete in the current layer group, the cores evaluate the layer group for the necessary further passes (as in the example of layer group LG3 in FIG. 16). When it is determined, in step 752 that there are no further passes to evaluate for the present layer group, the method proceeds to step 754, and the portions of output data from each of the passes are combined, to produce the output data of the layer group. This output data is written to the OCM 314 in step 756. In step 758, it is checked whether there is a further layer group to evaluate. If so, the method proceeds to step 748 again, to split the evaluation of the next layer group into passes. Note that, although only two instances of step 750 are shown in the flowchart, implying the presence of two cores, it will be understood that there are as many parallel instances of this step as there are cores occupied with the evaluation.

The output data of each layer group is written to the shared OCM 314b, so that it is accessible to all cores for the evaluation of the following layer group. The manner in which the evaluation is split, in step 748, and the manner in which the portions of output data are combined, in step 754, will depend on the characteristics of the layers in the layer group, and the dimension along which the evaluation is split. In some cases, the evaluation may be split by input channel C—whereby each core evaluates the layer group for a respective channel (or set of channels) of the input data. For instance, if the layer group includes a convolutional layer, with one filter, and each core processes a different input channel, this would mean that each core applies one channel of the filter kernel to the respective channel of the input data. The respective output portions produced by the different cores will then need to be combined by element-wise summation, to produce the output of the convolution. This can be done by an element-wise operations module of one of the cores 350, if available, or by another processing module, separate from the cores 350. The weights (and biases) for the different channels of the kernel may be stored in the local OCM 314a of each respective core, since each core only needs access to the weights for the channel (or channels) that it is responsible for evaluating.

If the layer group consists of element-wise operations, and each core processes a different input channel, then the respective output portions produced by the different cores can be combined by concatenating them in the input channel dimension (P-dimension). Note that, because the step of combining the respective output portions consists of concatenating them, this can be achieved by the individual cores simply writing the output portions to the appropriate locations in the shared OCM 314b. In other words, the "combining" of step 754 and the "writing" of step 756 may be carried out together, and may be carried out by each core immediately following the "evaluation" step 750.

The parameters governing the element-wise operations for each input channel can be split up and stored in the respective different local OCMs 314a. Similarly, for other operations that may be split by input channel, the parameters governing the processing of each channel can be split up into the respective different local OCMs 314a.

If the layer group includes a convolutional layer, with multiple output channels (filters) and the evaluation is split across the cores by output channel (F-dimension), then each core will be responsible for evaluating a given filter or set of filters. The weights (and biases) for the relevant filters can be stored in the local OCM 314a of the respective cores.

On the other hand, if the layer group includes a convolutional layer, and the evaluation is split across the cores along one of the traversed dimensions (for example, the X-dimension), then the weights and biases are stored in the shared OCM 314b, where they are accessible to all of the cores.

Some layers may be difficult, inefficient or impossible to split across multiple cores. For instance, it will be noted the layers LG1, LG2, and LG4 in FIG. 16 are not split across cores at all—they are executed in their entirety by a single core (potentially leaving the other cores idle, if there is no other work to occupy them). This approach can be used, for example, to process a fully connected layer comprising one filter.

Figure 15:
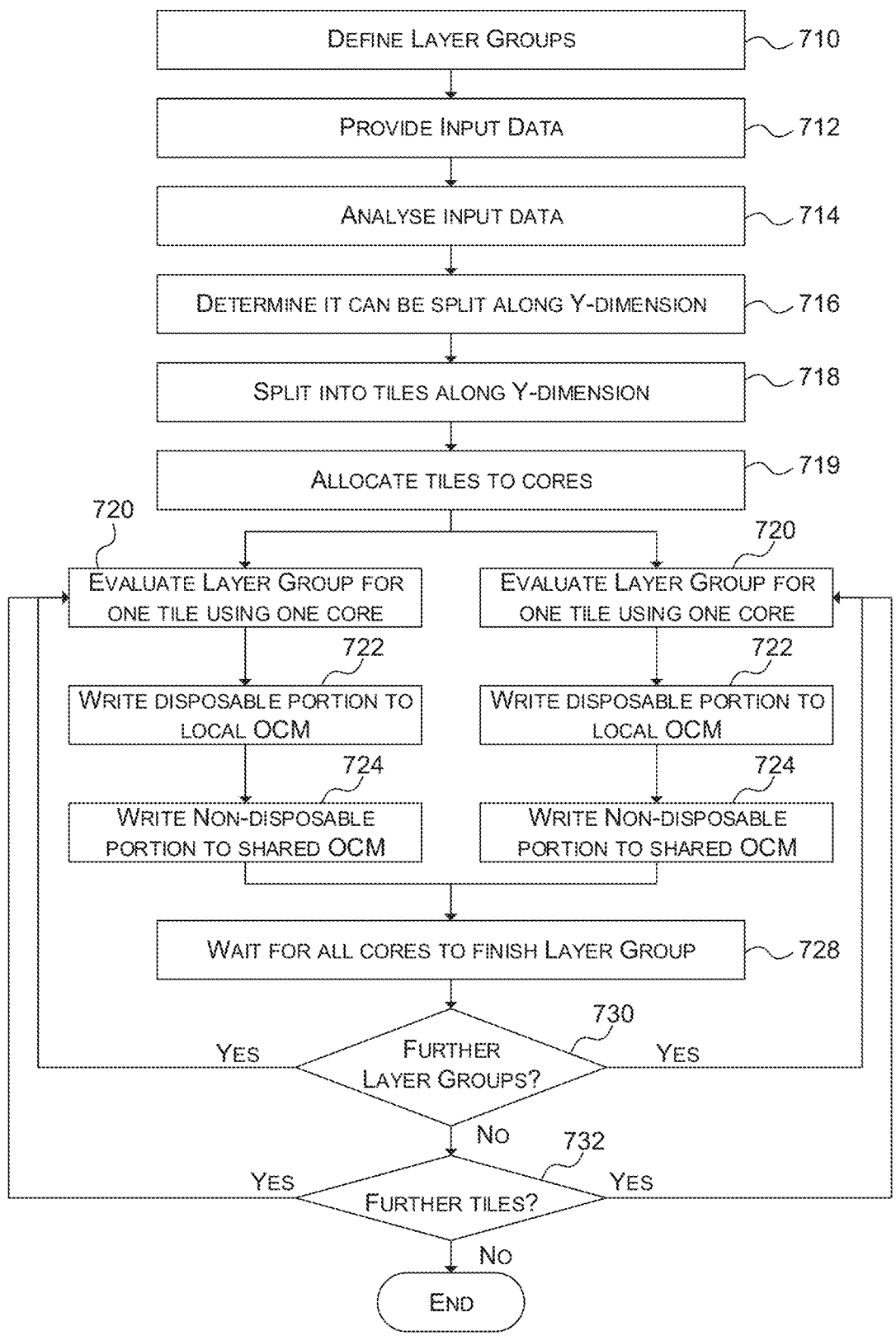
FIG. 15 is a flowchart showing a method for implementing a convolutional neural network in multicore hardware, when splitting input data into tiles.
Figure 17:
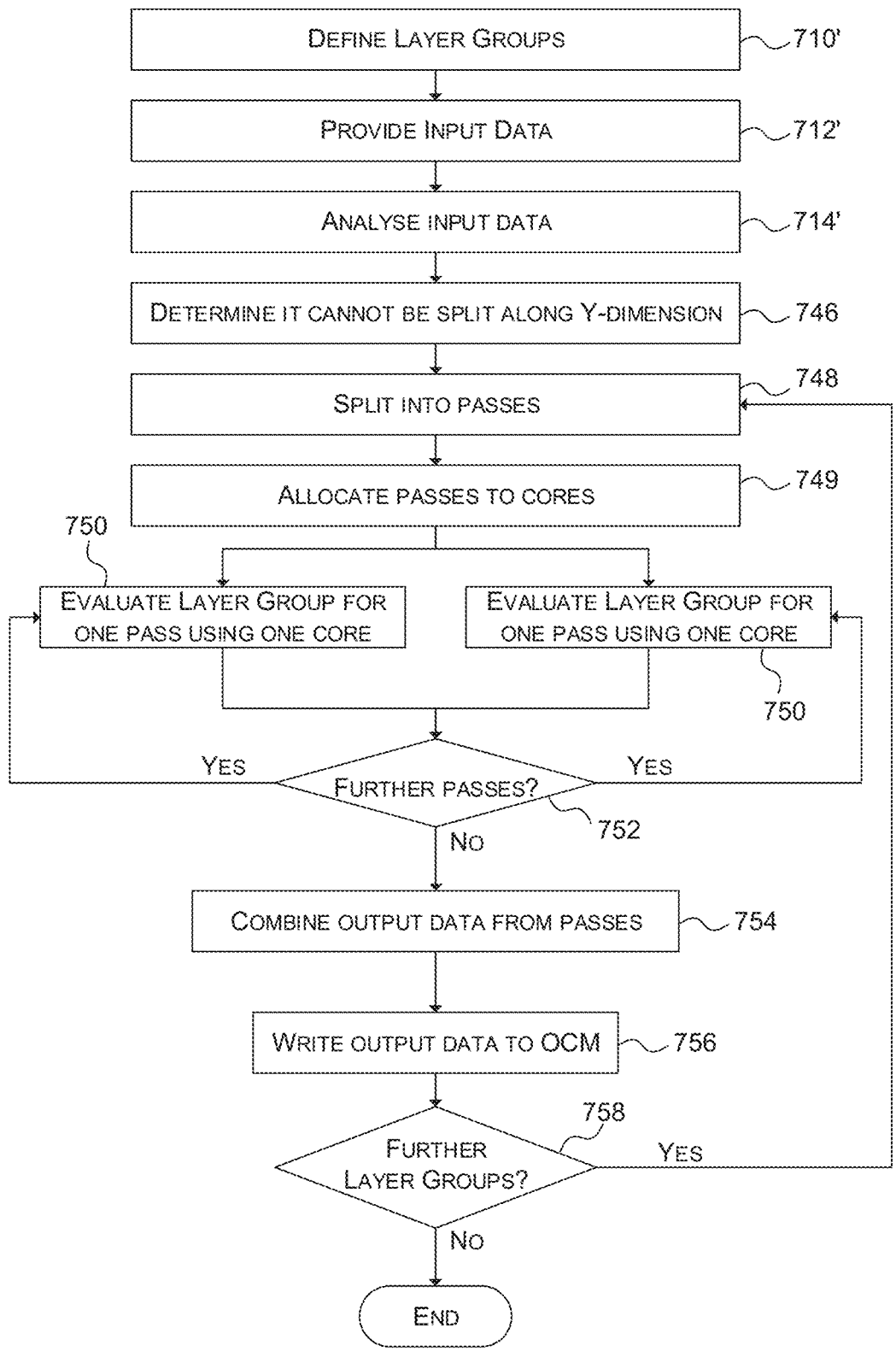
FIG. 17 is a flowchart showing a method for implementing a convolutional neural network in multicore hardware, when splitting the evaluation of the layers into passes.

As will by now be understood, the methods of FIG. 15 and FIG. 17 can be combined advantageously. The method of FIG. 15 can be used to process large input data tensors (that is, if the size is above the threshold, in the step 714 of analysing the size of the input data tensor). And the method of FIG. 17 can be used to process small input data tensors (if the size is below the threshold, in step 714'). In other words, the threshold used in step 714 and the threshold used in step 714' may be the same, such that either the method of FIG. 15 is followed, or the method of FIG. 17 is followed, by the hardware implementation 600.

A processing system may comprise a hardware implementation as described above, or may be configured to perform a method as described above. The processing system may be an artificial intelligence accelerator system—such as a neural network accelerator (NNA)—or a graphics processing system/graphics processing unit (GPU).

Figure 18:
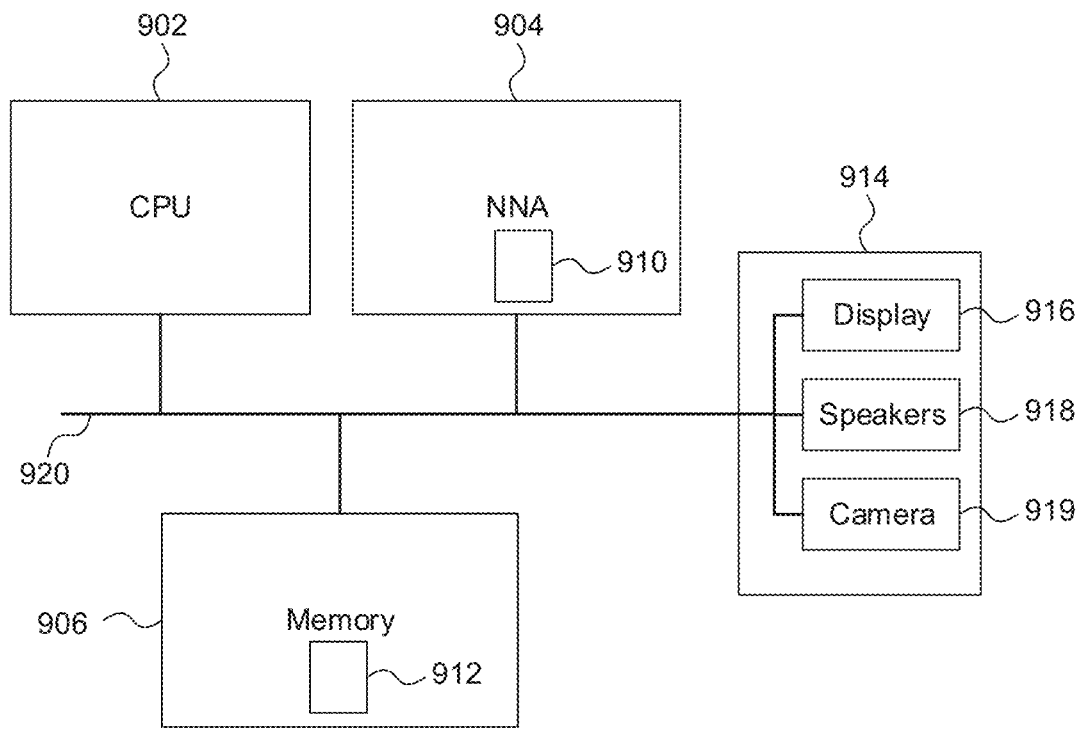
FIG. 18 shows a computer system in which a graphics processing system is implemented.

FIG. 18 shows a computer system in which a processing system according to the present disclosure may be implemented. The computer system comprises a CPU 902, an NNA 904, a memory 906 and other devices 914, such as a display 916, speakers 918 and a camera 919. A processing block 910 (corresponding to hardware implementation 600) is implemented on the NNA 904. In other examples, the processing block 910 may be implemented on the CPU 902. The components of the computer system can communicate with each other via a communications bus 920. A store 912 (corresponding to DDR 312) is implemented as part of the memory 906.

While FIG. 18 illustrates one implementation of an artificial intelligence accelerator system, it will be understood that a similar block diagram could be drawn for a graphics processing system—for example, by replacing either the CPU 902 or the NNA 904 with a GPU, or by adding the GPU as an additional unit. In such cases, the processing block 910 can be implemented in the GPU.

The hardware implementation 600 of FIG. 12 is shown as comprising a number of functional blocks. This is schematic only and is not intended to define a strict division between different logic elements of such entities. Each functional block may be provided in any suitable manner. It is to be understood that intermediate values described herein as being formed by a hardware implementation need not be physically generated by the hardware implementation at any point and may merely represent logical values which conveniently describe the processing performed by the hardware implementation between its input and output.

The hardware implementations described herein may be embodied in hardware on an integrated circuit. The hardware implementations described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java® or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, NNA, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a hardware implementation configured to perform any of the methods described herein, or to manufacture a hardware implementation comprising any apparatus described herein. An integrated circuit definition dataset may be, for example, an integrated circuit description.

Therefore, there may be provided a method of manufacturing, at an integrated circuit manufacturing system, a hardware implementation as described herein. Furthermore, there may be provided an integrated circuit definition dataset that, when processed in an integrated circuit manufacturing system, causes the method of manufacturing a hardware implementation to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a hardware implementation will now be described with respect to FIG. 19.

Figure 19:
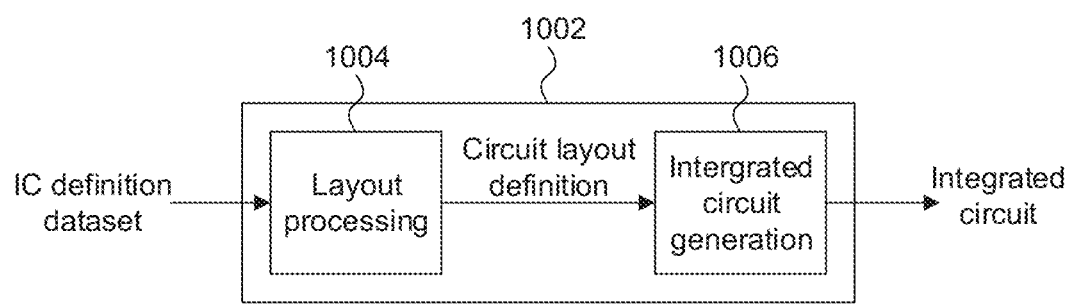
FIG. 19 shows an integrated circuit manufacturing system for generating an integrated circuit embodying a graphics processing system.

FIG. 19 shows an example of an integrated circuit (IC) manufacturing system 1002 which is configured to manufacture a hardware implementation as described in any of the examples herein. In particular, the IC manufacturing system 1002 comprises a layout processing system 1004 and an integrated circuit generation system 1006. The IC manufacturing system 1002 is configured to receive an IC definition dataset (e.g. defining a hardware implementation as described in any of the examples herein), process the IC definition dataset, and generate an IC according to the IC definition dataset (e.g. which embodies a hardware implementation as described in any of the examples herein). The processing of the IC definition dataset configures the IC manufacturing system 1002 to manufacture an integrated circuit embodying a hardware implementation as described in any of the examples herein.

The layout processing system 1004 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1004 has determined the circuit layout it may output a circuit layout definition to the IC generation system 1006. A circuit layout definition may be, for example, a circuit layout description.

The IC generation system 1006 generates an IC according to the circuit layout definition, as is known in the art. For example, the IC generation system 1006 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1006 may be in the form of computer-readable code which the IC generation system 1006 can use to form a suitable mask for use in generating an IC.

The different processes performed by the IC manufacturing system 1002 may be implemented all in one location, e.g. by one party. Alternatively, the IC manufacturing system 1002 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a hardware implementation without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 19 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 19, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method for implementing a deep neural network in multicore hardware, the deep neural network including a plurality of layers, the multicore hardware comprising at least a first core and a second core, the method comprising:
 defining a plurality of layer groups, including at least a first layer group and a second layer group, each layer group comprising one or more consecutive layers of the neural network, wherein output data of the first layer group comprises input data for the second layer group;
 providing, in one or more first memory devices, input data for the first layer group, the input data comprising a multidimensional tensor including one or more traversed dimensions, being dimensions that are traversed by strides in at least one layer of the first layer group, and one or more non-traversed dimensions;
 determining a size of the input data in a first dimension among the one or more traversed dimensions,
 if the size in the first dimension is greater than a threshold, evaluating the first and second layer groups by depth-first tiling, comprising:
  splitting the input data for the first layer group into at least a first tile and a second tile, along the first dimension, each tile comprising a plurality of data elements in each of the one or more traversed dimensions;
  using the first core, evaluating the first layer group based on the first tile, to generate a first output tile of the first layer group;
  using the second core, evaluating the first layer group based on the second tile, to generate a second output tile of the first layer group;

storing said first output tile and said second output tile of the first layer group in one or more second memory devices, as input data for the second layer group;

using the first core, evaluating the second layer group based on the first output tile of the first layer group, to generate a first output tile of the second layer group;

using the second core, evaluating the second layer group based on the second output tile of the first layer group, to generate a second output tile of the second layer group, and if the size in the first dimension is not greater than the threshold, evaluating the first and second layer groups in multiple passes, one layer group at a time, comprising:

splitting the evaluation of the first layer group into at least a first pass and a second pass, along a dimension other than the first dimension;

using the first core, evaluating the first layer group for the first pass, to generate a first portion of output data;

using the second core, evaluating the first layer group for the second pass, to generate a second portion of output data;

producing the output data of the first layer group, comprising combining the first portion of output data and the second portion of output data; and storing the output data of the first layer group in the one or more second memory devices, as input data for the second layer group.

2. The method of claim 1, further comprising if the size is not greater than the threshold, splitting the evaluation of the second layer group into at least a first pass and a second pass, along a dimension other than the first dimension;

allocating the first pass for the second layer group to the first core and allocating the second pass for the second layer group to the second core;

using the first core, evaluating the second layer group for the first pass, to generate a first portion of output data; and using the second core, evaluating the second layer group for the second pass, to generate a second portion of output data, each of said first portion of output data and said second portion of output data comprising a plurality of data elements.

3. The method of claim 1, wherein the plurality of layer groups comprises a third layer group comprising one or more consecutive layers of the neural network, the method further comprising, if the size is greater than the threshold, storing said first output tile and said second output tile of the second layer group in the one or more second memory devices as input data for the third layer group.

4. The method of claim 1, further comprising, if the size is greater than the threshold, storing the first output tile and the second output tile of a final one of the plurality of layer groups in the one or more first memory devices.

5. The method of claim 1, wherein, if the size is greater than the threshold, splitting the input data for the first layer group comprises splitting it into the first tile, the second tile and a third tile, the method further comprising, after evaluating, using the first core, each layer group based on the first tile, evaluating, using the first core, each layer group based on the third tile.

6. The method of claim 1, wherein the one or more second memory devices comprise:

a local memory for the first core that is accessible only to the first core;

a local memory for the second core that is accessible only to the second core; and a shared memory that is accessible to the first core and the second core, the method further comprising, if the size is greater than the threshold:

identifying a disposable portion of the first output tile of the first layer group, which is needed only for evaluating the second layer group based on the first tile; and identifying an overlap portion of the first output tile of the first layer group, which is needed for evaluating the second layer group based on the first tile and is also needed for evaluating the second layer group based on the second tile, the method comprising, when storing the first output tile of the first layer group in the one or more second memory devices:

writing the disposable portion of the first output tile to the local memory of the first core; and writing the overlap portion of the first output tile to the shared memory.

7. The method of claim 6, wherein the first layer group includes a convolutional layer, the method further comprising storing weight values and/or bias values for the convolutional layer in the shared memory.

8. The method of claim 1, comprising, if the size is greater than the threshold:

waiting for the first core to finish evaluating the first layer group for the first tile and waiting for the second core to finish evaluating the first layer group for the second tile, before evaluating the second layer group for the second tile using the second core.

9. The method of claim 1, wherein the one or more traversed dimensions further comprise a second dimension, wherein the input data is stored in the one or more first memory devices ordered according to the second dimension first.

10. The method of claim 1, wherein, if the size is not greater than the threshold, splitting the evaluation of the first layer group comprises splitting it into the first pass, the second pass and a third pass, the method further comprising:

allocating the third pass to the first core; and after evaluating, using the first core, the first layer group for the first pass, evaluating, using the first core, the first layer group for the third pass.

11. The method of claim 1, wherein the one or more second memory devices comprise:

a local memory for the first core that is accessible only to the first core;

a local memory for the second core that is accessible only to the second core; and a shared memory that is accessible to the first core and the second core, the method comprising, if the size is not greater than the threshold, storing the first portion of output data and the second portion of output data in the shared memory.

12. The method of claim 11, wherein one of:

(A) the first layer group comprises a convolutional layer, the method further comprising:

storing weight values and/or bias values for the convolutional layer in the shared memory, if the evaluation was split along one of the traversed dimensions; and splitting up the weight values and/or bias values and storing them in the local memories, if the evaluation was split along one of the non-traversed dimensions, and (B) the evaluation is split according to input channel, wherein the first layer group comprises no convolutional layer, and wherein the method comprises splitting up parameters of the first layer group and storing them in the local memories.

13. A hardware implementation of a deep neural network comprising a plurality of layers arranged in a plurality of layer groups, the plurality of layer groups including at least a first layer group and a second layer group, each layer group comprising one or more consecutive layers of the neural network, wherein output data of the first layer group comprises input data for the second layer group, the hardware implementation comprising:

one or more first memory devices, configured to store input data for the first layer group, the input data comprising a multidimensional tensor including one or more traversed dimensions, being dimensions that are traversed by strides in at least one layer of the first layer group, and one or more non-traversed dimensions;

one or more second memory devices, configured to store the output data of at least the first layer group;

a plurality of cores, comprising at least a first core and a second core; and a splitter unit, wherein the splitter unit is configured to determine a size of the input data in a first dimension among the one or more traversed dimensions, and if the size in the first dimension is greater than a threshold, the splitter unit is configured to split the input data for the first layer group into at least a first tile and a second tile, along the first dimension, each tile comprising a plurality of data elements in each of the one or more traversed dimensions, the first core is configured to evaluate the first layer group based on the first tile, to generate a first output tile of the first layer group, the second core is configured to evaluate the first layer group based on the second tile, to generate a second output tile of the first layer group, the first core and the second core are configured to store said first output tile and said second output tile of the first layer group in the one or more second memory devices, as input data for the second layer group, the first core is configured to evaluate the second layer group based on the first output tile of the first layer group, to generate a first output tile of the second layer group, and the second core is configured to evaluate the second layer group based on the second output tile of the first layer group, to generate a second output tile of the second layer group, and, if the size in the first dimension is not greater than the threshold, the splitter unit is configured to split the evaluation of the first layer group into at least a first pass and a second pass, along a dimension other than the first dimension, the first core is configured to evaluate the first layer group for the first pass, to generate a first portion of output data, the second core is configured to evaluate the first layer group for the second pass, to generate a second portion of output data, each of said first portion of output data and said second portion of output data comprising a plurality of data elements, the plurality of cores is configured to produce the output data of the first layer group, comprising combining the first portion of output data and the second portion of output data, and the plurality of cores is configured to store the output data of the first layer group in the one or more second memory devices, as input data for the second layer group.

14. The hardware implementation of claim 13, wherein, if the size in the first dimension is greater than the threshold, the first core and the second core are configured to store said first output tile and said second output tile of a final one of the defined layer groups in the one or more first memory devices.

15. The hardware implementation of claim 13, wherein, if the size in the first dimension is greater than the threshold, the splitter unit is configured to split the input data for the first layer group into the first tile, the second tile and a third tile, and the first core is configured to evaluate each layer group based on the third tile after it has finished evaluating each layer group based on the first tile.

16. The hardware implementation of claim 13, wherein the one or more second memory devices comprise:

a local memory for the first core that is accessible only to the first core;

a local memory for the second core that is accessible only to the second core; and a shared memory that is accessible to the first core and the second core, wherein the splitter is configured to, if the size in the first dimension is greater than the threshold:

identify a disposable portion of the first output tile of the first layer group, which is needed only for evaluating the second layer group based on the first tile; and identify an overlap portion of the first output tile of the first layer group, which is needed for evaluating the second layer group based on the first tile and also needed for evaluating the second layer group based on the second tile, and the first core is configured, when storing the first output tile of the first layer group in the one or more second memory devices to:

write the disposable portion to its local memory; and write the overlap portion to the shared memory.

17. The hardware implementation of claim 13, wherein the one or more second memory devices comprise:

a local memory for the first core that is accessible only to the first core;

a local memory for the second core that is accessible only to the second core; and a shared memory that is accessible to the first core and the second core, wherein, if the size in the first dimension is not greater than the threshold, the plurality of cores is configured to store the first portion of output data and the second portion of output data in the shared memory.

18. An artificial intelligence accelerator system, comprising the hardware implementation of claim 13.

19. A non-transitory computer readable storage medium having stored thereon computer readable code configured to cause the method of claim 1 to be performed when the code is run.

20. A non-transitory computer readable storage medium having stored thereon an integrated circuit definition dataset that, when processed in an integrated circuit manufacturing system, configures the integrated circuit manufacturing system to manufacture an artificial intelligence accelerator system as claimed in claim 18.

* * * * *